(12) United States Patent
Lee et al.

(10) Patent No.: US 10,790,291 B2
(45) Date of Patent: Sep. 29, 2020

(54) NON-VOLATILE MEMORY DEVICE

(71) Applicant: SAMSUNG ELECTRONICS CO., LTD., Suwon-si, Gyeonggi-Do (KR)

(72) Inventors: Youn-Yeol Lee, Seoul (KR); Wook-Ghee Hahn, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/241,095

(22) Filed: Jan. 7, 2019

(65) Prior Publication Data
US 2020/0013787 A1    Jan. 9, 2020

(30) Foreign Application Priority Data
Jul. 3, 2018   (KR) ................. 10-2018-0077323

(51) Int. Cl.
| | |
|---|---|
| *G11C 16/24* | (2006.01) |
| *H01L 27/11524* | (2017.01) |
| *H01L 27/11551* | (2017.01) |
| *H01L 27/112* | (2006.01) |
| *G11C 16/08* | (2006.01) |
| *G11C 16/04* | (2006.01) |
| *G11C 7/10* | (2006.01) |
| *G11C 5/02* | (2006.01) |

(52) U.S. Cl.
CPC ........ *H01L 27/11524* (2013.01); *G11C 5/025* (2013.01); *G11C 7/1039* (2013.01); *G11C 16/0483* (2013.01); *G11C 16/08* (2013.01); *G11C 16/24* (2013.01); *H01L 27/11273* (2013.01); *H01L 27/11551* (2013.01); *G11C 2207/002* (2013.01)

(58) Field of Classification Search
CPC ................. G11C 16/10; G11C 16/26
USPC ....................... 365/185.15, 185.24
See application file for complete search history.

(56) References Cited

U.S. PATENT DOCUMENTS

| | | | | |
|---|---|---|---|---|
| 4,745,579 | A * | 5/1988 | Mead | G11C 16/0425 326/40 |
| 5,550,394 | A * | 8/1996 | Sukegawa | G11C 29/78 257/209 |
| 6,333,866 | B1 | 12/2001 | Ogata | |
| 6,421,272 | B1 | 7/2002 | Noguchi | |
| 6,512,702 | B1 * | 1/2003 | Yamamura | G11C 16/0483 365/185.18 |
| 6,922,359 | B2 | 7/2005 | Ooishi | |
| 7,466,597 | B2 | 12/2008 | Kim | |
| 7,480,187 | B2 | 1/2009 | Hwang | |
| 9,099,180 | B2 | 8/2015 | Minemura et al. | |
| 9,799,672 | B2 | 10/2017 | Son et al. | |
| 2002/0008254 | A1 * | 1/2002 | Noda | G11C 5/025 257/203 |

(Continued)

*Primary Examiner* — Michael T Tran
(74) *Attorney, Agent, or Firm* — Volentine, Whitt & Francos, PLLC

(57) ABSTRACT

A non-volatile memory device includes an upper semiconductor layer vertically stacked on a lower semiconductor layer. The upper semiconductor layer includes a first memory group spaced apart from a second memory group in a first horizontal direction by a separation region, and the lower semiconductor layer includes a bypass circuit underlying at least a portion of the separation region and configured to selectively connect a first bit line of the first memory group with a second bit line of the second memory group.

20 Claims, 18 Drawing Sheets

(56) References Cited

U.S. PATENT DOCUMENTS

| | | | | |
|---|---|---|---|---|
| 2003/0090934 A1* | 5/2003 | Iwata | | G11C 11/1673 |
| | | | | 365/158 |
| 2005/0013156 A1* | 1/2005 | Hoya | | G11C 11/22 |
| | | | | 365/145 |
| 2005/0052914 A1 | 3/2005 | Miyamoto et al. | | |
| 2007/0235833 A1* | 10/2007 | Cheng | | H01L 27/10841 |
| | | | | 257/506 |
| 2007/0242512 A1* | 10/2007 | Park | | G11C 11/5628 |
| | | | | 365/185.05 |
| 2009/0184389 A1* | 7/2009 | Bertin | | H01L 29/861 |
| | | | | 257/476 |
| 2009/0303770 A1* | 12/2009 | Shibata | | G11C 5/063 |
| | | | | 365/63 |
| 2011/0298013 A1* | 12/2011 | Hwang | | H01L 27/088 |
| | | | | 257/208 |
| 2013/0009229 A1* | 1/2013 | Lee | | H01L 29/66833 |
| | | | | 257/314 |
| 2013/0250683 A1* | 9/2013 | Hosono | | G11C 16/0483 |
| | | | | 365/185.05 |
| 2014/0063959 A1* | 3/2014 | Tanzawa | | G11C 16/0483 |
| | | | | 365/185.17 |
| 2014/0082459 A1* | 3/2014 | Li | | G06F 11/1666 |
| | | | | 714/773 |
| 2014/0112055 A1* | 4/2014 | Kawahara | | G11C 13/0023 |
| | | | | 365/148 |
| 2014/0293672 A1* | 10/2014 | Yi | | G06F 13/28 |
| | | | | 365/72 |
| 2015/0262681 A1* | 9/2015 | Hosono | | G11C 16/10 |
| | | | | 365/185.18 |
| 2017/0054074 A1* | 2/2017 | Sasago | | H01L 45/06 |
| 2017/0092748 A1* | 3/2017 | Ting | | H01L 29/66272 |
| 2017/0169897 A1* | 6/2017 | Lee | | G11C 16/08 |
| 2018/0315769 A1* | 11/2018 | Huo | | H01L 29/10 |
| 2018/0358102 A1* | 12/2018 | Zhang | | G11C 16/3459 |
| 2019/0035480 A1* | 1/2019 | Lu | | G11C 11/5671 |
| 2019/0273883 A1* | 9/2019 | Sakakibara | | H04N 5/379 |

\* cited by examiner

NON-VOLATILE MEMORY DEVICE

CROSS-REFERENCE TO RELATED APPLICATION

This application claims the benefit of Korean Patent Application No. 10-2018-0077323, filed on Jul. 3, 2018, in the Korean Intellectual Property Office, the subject matter of which is hereby incorporated by reference.

BACKGROUND

The inventive concept relates to memory devices and in particular non-volatile memory devices.

Contemporary electronic devices, including information communication devices, may be characterized by the provision of multiple functions, increasing large data storage capacities, and very density integration of constituent components including memory devices. As a result, the demands placed on memory devices are considerable. Memory cell size must be reduced, wiring patterns/structures must be reduced in size, and the electrical/operational connectivity between constituent components must be efficiently provided to reduce overall size while maintaining high performance.

Accordingly, memory devices, including non-volatile memory devices, must be developed that provide high performance capabilities, large data storage capacities, and dense component integration.

SUMMARY

Certain embodiments of the inventive concept provide non-volatile memory devices including a cell-on-peripheral (COP) structure.

According to an aspect of the inventive concept, there is provided a non-volatile memory including an upper semiconductor layer vertically stacked on a lower semiconductor layer. The upper semiconductor layer includes a first memory group spaced apart from a second memory group in a first horizontal direction by a separation region, and the lower semiconductor layer includes a bypass circuit underlying at least a portion of the separation region and configured to selectively connect a first bit line of the first memory group with a second bit line of the second memory group.

According to another aspect of the inventive concept, there is provided a method for internally transferring data in a non-volatile memory including an upper semiconductor layer vertically stacked on a lower semiconductor layer. The upper semiconductor layer includes a first memory group and a second memory group separated in a first horizontal direction by a separation region, and the lower semiconductor layer includes a bypass circuit underlying at least a portion of the separation region. The method includes sensing first data stored in a first memory block of the first memory group using a first page buffer associated with the first memory group and storing the first data in the bypass circuit, transferring the first data stored in the bypass circuit to a second page buffer associated with the second memory group, and programming the first data transferred to the second page buffer in a first memory block of the second memory group.

According to another aspect of the inventive concept, there is provided in a method of internally transferring data from the first memory group to the second memory group in a non-volatile memory device. The non-volatile memory device includes control logic, an upper semiconductor layer vertically stacked on a lower semiconductor layer, wherein the upper semiconductor layer includes a first memory group and a second memory group and the lower semiconductor layer includes a bypass circuit. In the method, the control logic generates a first memory group row address and a first memory group column address to read first data stored in the first memory group using a first row decoder and a first page buffer, the control logic activates a connection control signal applied to the bypass circuit to transfer-in the first data to the bypass circuit, the control logic activates the connection control signal circuit to transfer-out the first data from the bypass circuit to a second page buffer, and the control logic generates a second memory group row address and a second memory group column address to program the first data stored in the second page buffer to the second memory group using the second page buffer and a second row decoder, wherein the first memory group is electrically isolated from the second memory group by a separation region in the upper semiconductor layer, and the bypass circuit underlies at least a portion of the separation region.

According to another aspect of the inventive concept, there is provided in a three-dimensional (3D), non-volatile memory including; control logic that generates a connection control signal, an upper semiconductor layer vertically stacked on a lower semiconductor layer, wherein the upper semiconductor layer includes a first memory group electrically isolated from a second memory group by a separation region, the first memory group including a first set of tiles including a first tile incorporating a first memory cell array, and the second memory group including a second set of tiles including a second tile incorporating a second memory cell array, and the lower semiconductor layer includes a bypass circuit underlying at least a portion of the separation region, wherein the bypass circuit is configured to selectively connect a first bit line of the first tile with a second bit line of the second tile in response to the connection control signal.

BRIEF DESCRIPTION OF THE DRAWINGS

Embodiments of the inventive concept may be more clearly understood upon consideration of the following detailed description taken in conjunction with the accompanying drawings in which.

DETAILED DESCRIPTION

Hereinafter, certain embodiments of the inventive concept will be described in some additional detail with reference to the accompanying drawings.

Figure 1:
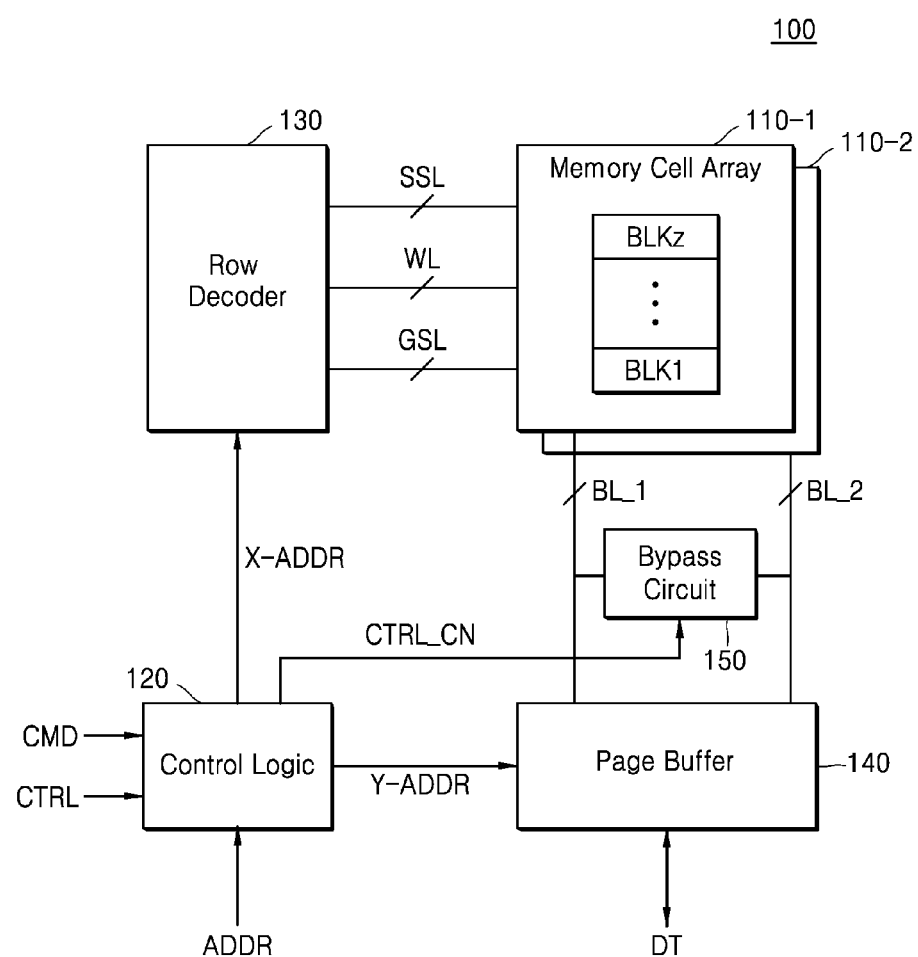
FIG. 1 is block diagram illustrating a non-volatile memory device according to an embodiment of the inventive concept.

Figure (FIG. 1 is block diagram illustrating a memory device 100 according to an embodiment of the inventive concept.

Referring to FIG. 1, the memory device 100 may include a first memory cell array 110-1, a second memory cell array 110-2, control logic 120, a row decoder 130, a page buffer 140, and a bypass circuit 150. Although not shown in FIG. 1, the memory device 100 may further include data input/output (I/O) circuit(s), I/O interface(s), error detection and/or correction circuitry, etc. The memory device 100 may further include voltage generator(s) that generate one or more voltages used during program, read, and/or erase operations.

The execution of program, read and/or erase operation(s) in relation to the memory cells of the first and second memory cell arrays 110-1 and 110-2 may be controlled by operation of the control logic 120.

Each of the first and second memory cell arrays 110-1 and 110-2 may include a vast plurality of memory cells. In certain embodiments of the inventive concept, the memory cells may variously connected to string selection lines SSL, word lines WL, bit lines BL, ground selection lines GSL, etc. For example, the first and second memory cell arrays 110-1 and 110-2 may be connected to the row decoder 130 via string selection lines SSL, word lines WL, and ground selection lines SSL.

As shown in the illustrated example of FIG. 1, the first memory cell array 110-1 may be connected to the page buffer 140 via first bit lines BL_1, and the second memory cell array 110-2 may be connected to the page buffer 140 via second bit lines BL_2. Here, the connection of one or more memory cell arrays to one or more page buffers via bit lines, regardless of specific bit line configuration(s), may be may in relation to the bypass circuit 150. This feature will be described hereafter in more detail.

Embodiments of the inventive concept may include one or more memory cell arrays including non-volatile memory cells. In this context, a non-volatile memory cell is a memory cell capable of retaining stored data in the absence of applied power. Those skilled in the art will recognize that there are many different types of non-volatile memory cells that may be used in embodiments of the inventive concept. For example, the constituent memory cells of the first and second memory cell arrays 110-1 and 110-2 shown in FIG. 1 may include one or more of electrical erasable programmable read only memory (EEPROM), flash memory, phase-change random access memory (PRAM), resistive random access memory (RRAM), nano floating gate memory (NFGM), polymer random access memory (PoRAM), magneto-resistive random access memory (MRAM), ferroelectric random access memory (FRAM), etc. Hereinafter, certain embodiments of the inventive concept will be described that assume the incorporation and use of NAND flash memory cells, but the scope of the inventive concept is not limited thereto.

The non-volatile memory cells of the first and second memory cell arrays 110-1 and 110-2 may be arranged in a plurality of memory blocks BLK1 to BLKz. Each memory block of the plurality of memory blocks BLK1 to BLKz may have a two-dimensional (or planar) structure or a three-dimensional (or vertical) structure. The memory cells of the first and second memory cell arrays 110-1 and 110-2 may be configured to operate as single level memory cells (SLC) or multi-level memory cells (MLC—e.g., triple level memory cells TLC or quad level cells QLCs). Thus, where the memory cells of a particular memory block among the memory blocks BLK1 to BLKz are SLC (or MLC), the particular block may be designated for operation as a SLC block (or a MLC block—e.g., a TLC block or QLC block).

The control logic 120 of FIG. 1 may be used to generate and provide a variety of control signals associated with program, read and/or erase operations. Of course, the number and type of control signals may vary by design, but examples of common control signals provided by the control logic 120 include row address(es), column address(es), voltage control signals, etc. In this regard, the particular generation of control signal(s) by the control logic 120 is deemed to be well within the capabilities of one of ordinary skill in the art. In many instances, the various control signals generated by the control logic 120 may be generated in response to one or more externally generated (e.g., by an external memory controller not shown) command(s) CMD, address(es) ADDR, and/or control signal(s) CTRL.

According to embodiments of the inventive concept, the control logic 120 may generate and provide a connection control signal CTRL_CN that controls the operation of the bypass circuit 150 in addition to the more conventionally understood control signals.

The bypass circuit 150 of FIG. 1 may be variously configured according to design, but generally considered, the bypass circuit 150 enables a selective, electrical connection between at least one bit line of the first bit lines BL_1 associated with the first memory cell array 110-1 and at least another bit line of the second bit lines BL_2 associated with the second memory cell array 110-2. Stated with less specific context to the illustrated embodiment of FIG. 1, the bypass circuit 150 may be used to selectively connect a first bit line of a first memory group with a second bit line of a second memory group in response to the connection control signal CTRL_CN provide by the control logic 120.

In certain embodiments of the inventive concept where the bypass circuit 150 includes one or more transistors, the control logic 120 may provide the connection control signal CTRL_CN directly to the gate(s) of each of respective transistor(s). In this manner, control of the bypass circuit 150 may be very simply configured.

With the foregoing discussion of FIG. 1 in mind, the row decoder 130 may be used to select a memory block from among the memory blocks BLK1 to BLKz, select a word line from among the set of first word lines of the selected memory block, and select a string selection line from among the string selection lines SSL—all in response to (e.g.,) the row address X-ADDR received from the control logic 120. The row decoder 130 may also be used to transfer to the selected word line of the selected memory block, one or more voltage(s) necessary to the execution of a current memory operation. For example, in an erase operation, the row decoder 130 may transfer an erase voltage and a verification voltage to the selected word line and may transfer a pass voltage to unselected word lines.

The page buffer 140 may be used to send/receive data DT to/from an external device (not shown). In response to the column address Y-ADDR, the page buffer 140 may select one or more bit line(s) from among the first bit lines BL_1 and the second bit lines BL_2. The page buffer 140 may operate as a write driver or a sense amplifier depending on the operation being executed by the memory device 100. For example, the page buffer 140 may apply a sensing voltage to the first bit lines BL_1 and the second bit lines BL_2 in order to read data stored in each of the first and second memory cell arrays 110-1 and 110-2.

As noted above, the bypass circuit 150 may connected to at least one of the first bit lines BL_1 and to at least one of the second bit lines BL_2. Thus, in response to the connection control signal CTRL_CN, the bypass circuit 150 may electrically connect at least one of the first bit lines BL_1 to at least one of the second bit lines BL_2. In certain embodiments of the inventive concept, the bypass circuit 150 may include a single transistor having a first source/drain connected to a first bit line of the first bit lines BL_1 of a first memory group, a second source/drain connected to a second bit line of the second bit lines BL_2 of a second memory group, and a gate connected to a signal line providing the connection control signal CTRL_CN. In this manner a single transistor connection may be used to selectively connect a first bit line of a first memory group with a second bit line of a second memory group in response to the connection control signal CTRL_CN provided by the control logic 120.

However specifically configured, the bypass circuit 150 may be used to control data movement between the first and second memory cell arrays 110-1 and 110-2 in response to one or more control signals provided by the control logic 120. That is, for example, the control logic 120 may generate the connection control signal CTRL_CN in response to an externally provided command CMD and provide the connection control signal CTRL_CN to the bypass circuit 150 in order to effectively transfer data between the memory cells of the first memory cell array 110-1 and memory cells of the second memory cell array 110-2 through the bypass circuit 150. This bypass circuit 150 data transfer capability allows an "internal" transfer of data between otherwise electrically isolated memory cell arrays (or memory groups) of memory device 100 without resort to an external data buffer, register or similar memory resource.

Figure 2A:
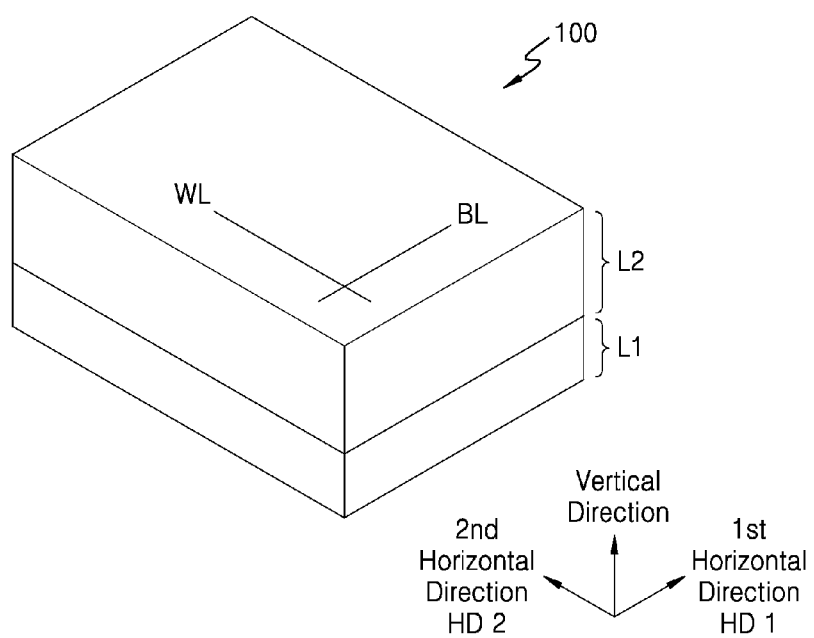
FIGS. 2A and 2B are perspective diagrams further illustrating in possible implementation structures for the memory device of FIG. 1.
Figure 2B:
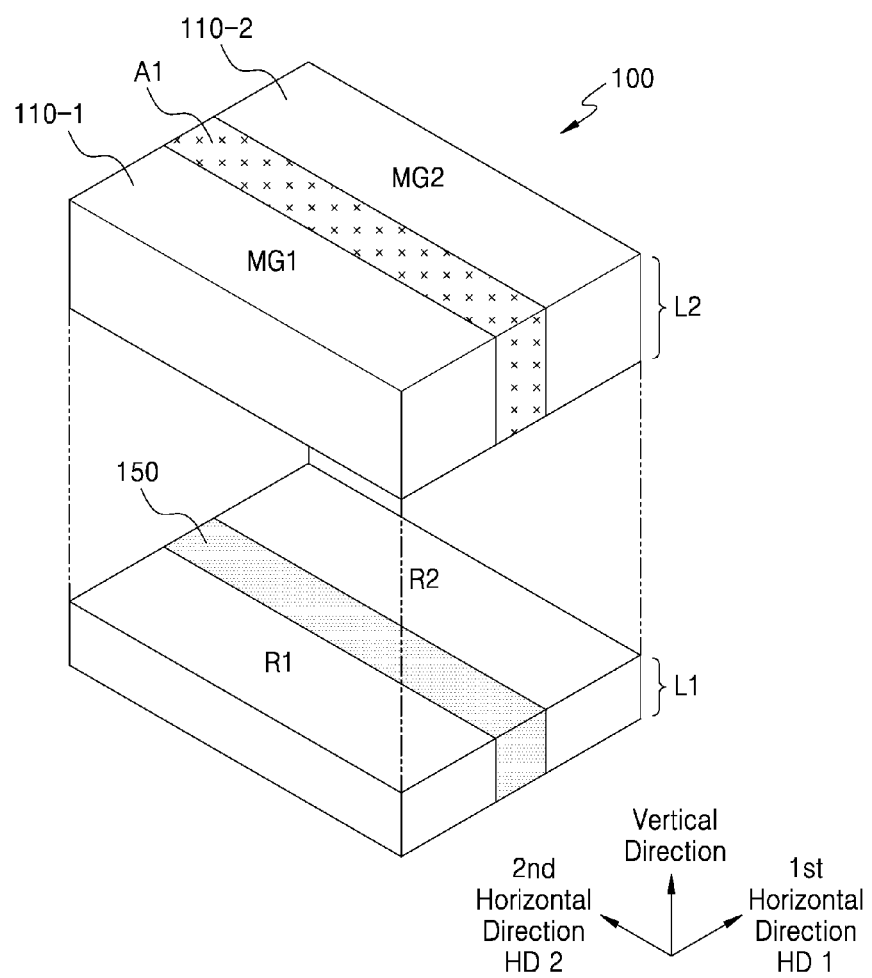

FIGS. 2A and 2B are perspective diagrams respectively illustrating one possible structure for the memory device 100 of FIG. 1.

Various material layer(s), feature(s) and/or structure(s) forming the first and second memory cell arrays 110-1 and 110-2 may be arranged above (or vertically stacked on) material layer(s), feature(s), and structure(s) forming a peripheral circuitry. Hereafter, for the sake of descriptive simplicity, the various material layer(s), feature(s) and/or structure(s) forming the one or more memory cell array(s) of the inventive concept will be referred to as a "first semiconductor layer" which is said to be vertically stacked on a "second semiconductor layer" including the various material layer(s), feature(s) and/or structure(s) forming the peripheral circuitry. In this regard, it is possible that in certain embodiments of the inventive concept, some relatively smaller peripheral circuits may be disposed in the first semiconductor layer with the memory cell array, but principal or relatively larger peripheral circuitry will typically be disposed in the second semiconductor layer. In this regard, the peripheral circuitry may be arranged proximate to a principal substrate, whereas the memory cell array(s) may be arranged more distant from the principal substrate.

In this regard, certain embodiments and embodiment features may be described hereafter using spatial, relational and/or geometric terms such as "above", "below", "on top of", "under" "vertical", "horizontal", "stacked on", "underlying", "first direction", "second direction", etc. Those skilled in the art will recognize that these and similar terms may be used in accordance with arbitrarily assumed orientations to better describe embodiment features. The use of such spatial, relational and/or geometric terms will usually be made with reference to one or more illustrated examples. It follows that as assumed geometric orientations change, so too may the relative spatial, relational and/or geometric descriptions.

Hence, referring to FIG. 2A, the memory device 100 may include a first semiconductor layer L1 that is vertically stacked on a second semiconductor layer L2. Given this assumed orientation for the "vertical" direction, the first semiconductor layer L1 and the second semiconductor layer L2 may be understood as extending in respective "horizontal" directions (i.e., in a first horizontal direction HD1 and a second horizontal direction HD2). In certain embodiments the second semiconductor layer L2 may be disposed, entirely or in part, on a principal, horizontally-disposed substrate.

Given this descriptive nomenclature, the first semiconductor layer L1 may be referred to as a "lower semiconductor layer", and the second semiconductor layer L2 may be referred to as an "upper semiconductor layer."

As noted above, certain peripheral circuitry may be disposed in the lower semiconductor layer L1. For example, one or more of the control logic 120, row decoder 130, page buffer 140, and bypass circuit 150 described in relation to FIG. 1 may be disposed in the lower semiconductor layer L1, whereas the first and second memory cell arrays 110-1 and 110-2 may be disposed in upper semiconductor layer L2. Here, the lower semiconductor layer L1 may include the principal substrate, wiring patterns and wiring elements, as well as various semiconductor devices.

The peripheral circuitry disposed in the lower semiconductor layer L1 may be variously connected to one or more memory groups (e.g., first and second memory cell arrays 110-1 and 110-2) disposed in the upper semiconductor layer L2. As will be appreciated by those skilled in the art, the memory group(s) of the upper semiconductor layer L2 will include word lines WL, bit lines BL, and other connections appropriated to the number, type and layout of constituent memory cells. For example, the upper semiconductor layer L2 may include a plurality of secondary substrates, and by forming a plurality of pillars which pass through a plurality of gate conductive layers and a plurality of gate conductive layers respectively stacked on the secondary (or upper) substrates and extend in the vertical direction the memory group(s) may be variously connected to the peripheral circuitry of the lower semiconductor layer L1.

As indicated by the illustration of FIG. 2A, the word lines WL of a particular memory group may extend in one horizontal direction (e.g., the second horizontal direction HD2) and the bit lines BL of the particular memory group may extend in another horizontal direction (e.g., the first horizontal direction HD1).

From the foregoing it will be understood that the memory device 100 of FIG. 1 may in certain embodiments of the inventive concept have a Cell-On-Peri or Cell-over-Peri (COP) structure. This COP structure allows various peripheral circuitry (e.g., one or more of the control logic 120, row decoder 130, page buffer 140, and bypass circuit 150 among other types of peripheral circuitry) to be arranged in a lower semiconductor layer underlying an upper semiconductor layer including one or more memory groups (e.g., the first or second memory cell array 110-1 or 110-2). As will be appreciated by those skilled in the art, the COP structure of certain embodiments of the inventive concept may greatly reduce a lateral footprint of the memory device 100 when incorporated within a host device by essentially stacking memory groups in an upper semiconductor layer L2 on top of peripheral circuitry in a lower semiconductor layer L1.

Although not shown in FIG. 2A, a plurality of pads may be provided that facilitate electrical connection of the memory device 100 with one or more external device(s). Such connection pads may be used, for example, to connect signal lines communicating (i.e., sending and/or receiving) the command(s) CMD, address(es) ADDR, control signal(s) CTRL, and data DT of FIG. 1. In certain embodiments of the inventive concept, it will be convenient to provide the pads proximate one or more peripheral circuits of the lower semiconductor layer L1, but this need not always be the case.

Referring to FIG. 2B, a first memory group MG1 (e.g., the first memory cell array 110-1) and a second memory group MG2 (e.g., the second memory cell arrays 110-2) are physically separated and electrically isolated from each one another in the first horizontal direction HD1 by a separation region A1. Further, a first peripheral circuit region R1 disposed in the lower semiconductor layer L1 may underlie the first memory group MG1 and a second peripheral circuit region R2 disposed in the lower semiconductor layer L1 may underlie the second memory group MG1. Here, the first region R1 and second region R2 may be separated by a region of the lower semiconductor layer L1 including the bypass circuit 150 in certain embodiments of the inventive concept.

Thus, in certain embodiments of the inventive concept, the bypass circuit 150 may be disposed in the lower semiconductor layer L1 such that it underlies, at least in part, the separation region A1. In some embodiments of the inventive concept, the bypass circuit 150 may be disposed in the lower semiconductor layer L1 in the second horizontal direction HD2.

Figure 3:
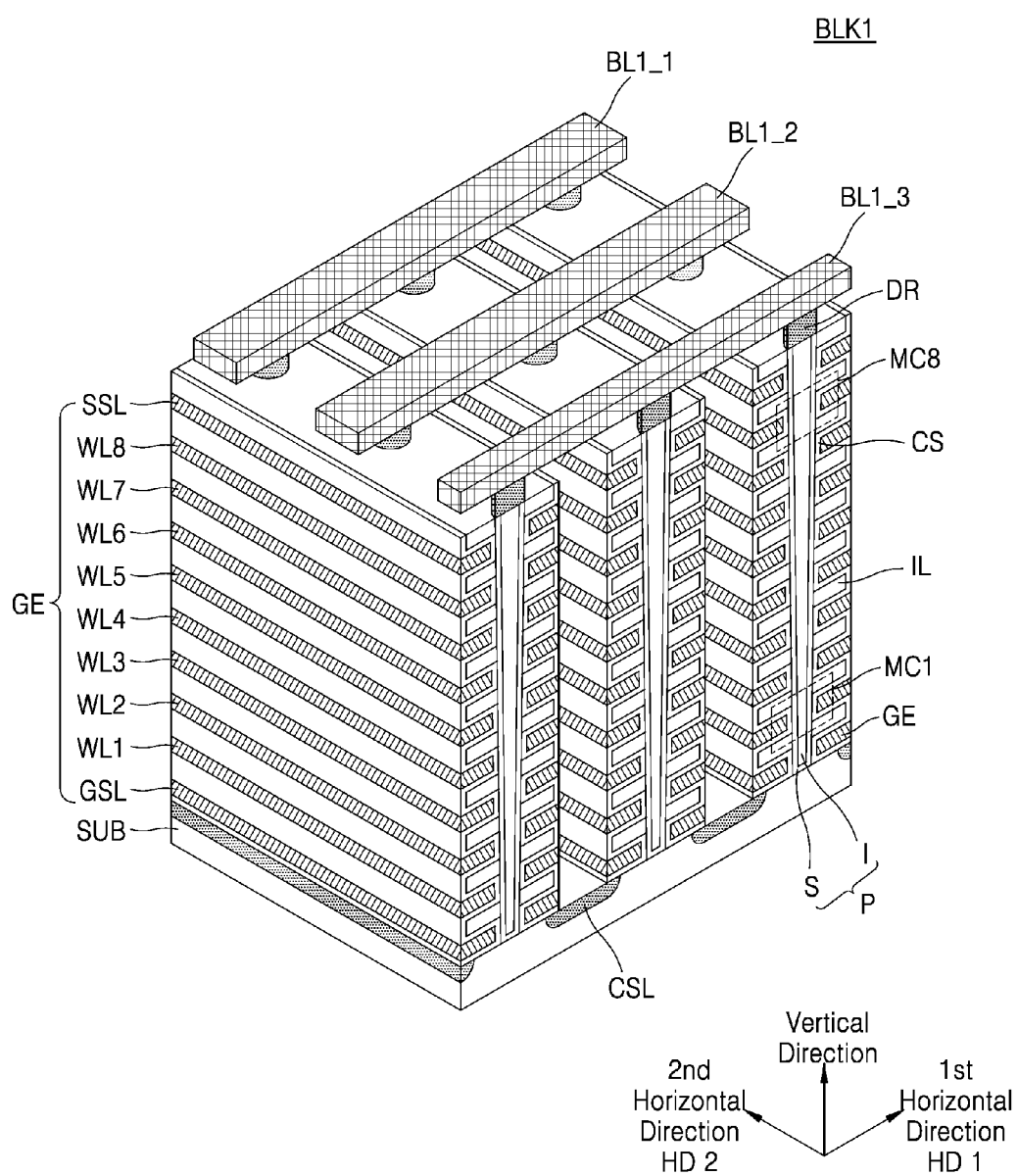
FIG. 3 is another perspective diagram further illustrating a possible implementation structure for the first memory block BLK of FIG. 1.

FIG. 3 is another perspective view further illustrating one possible implementation example for a first memory block BLK1 of the memory blocks of FIG. 1.

Referring to FIG. 3, the first memory block BLK1 may have a structure vertically extending from a principal substrate SUB. The first memory block BLK1 is illustrated as including two selection lines (e.g., a ground selection line and a string selection line) GSL and SSL, eight (8) word lines (e.g., first to eighth word lines) WL1 to WL8, and three (3) bit lines BL1_1 to BL1_3. However, this is merely an exemplary structure provide for convenience of description, and the number of connection lines will vary by design. For example, the first memory block BLK1 may include one or more dummy word lines between the first word line WL1 and the ground selection line GSL and/or between the eighth word line WL8 and the string selection line SSL.

The substrate SUB may be a polysilicon film doped with a first conductive type (for example, a p type) impurity. The substrate SUB may be a bulk silicon substrate, a silicon on insulator (SOI) substrate, a germanium substrate, a germanium on insulator (GOI) substrate, a silicon germanium substrate, or an epitaxial thin-film substrate obtained by performing selective epitaxial growth (SEG). The substrate SUB may include a semiconductor material, and for example, may include at least one of silicon (Si), germanium (Ge), SiGe, gallium arsenic (GaAs), indium gallium arsenic (InGaAs), and aluminum gallium arsenic (AlGaAs), or a compound thereof.

A common source line CSL doped with a second conductive type (e.g., an N-type) impurity may be provided on the substrate SUB and extend in the second horizontal direction HD2. A plurality of insulation layers IL extending in the second horizontal direction HD2 may be sequentially provided in region(s) between adjacent common source lines CSL and the substrate SUB, where the plurality of insulation layers IL are spaced apart from one another in the vertical direction. For example, the plurality of insulation layers IL may each include an insulating material such as silicon oxide.

A plurality of pillars P, which are sequentially arranged in the second horizontal direction HD2 and pass through the plurality of insulation layers IL in the vertical direction, may be provided in a region of the substrate SUB with the common source line CSL therebetween. For example, the plurality of pillars P may pass through the plurality of insulation layers IL and may contact the substrate SUB. Here, a surface layer of each of the pillars P may include silicon doped in the first conductive type (e.g., a P-type) impurity to act as a channel region. Herein, a pillar P may be referred to as a vertical channel structure. An inner layer I of each pillar P may include an air gap or an insulating material such as silicon oxide, and in certain embodiments the size of a channel hole in each pillar P may decrease in the vertical direction towards the substrate SUB.

A charge storage layer CS may be provided on the substrate SUB with the common source line CSL therebetween along the insulation layers IL, the pillars P, and an exposed surface of the substrate SUB. The charge storage layer CS may include a gate insulation layer (or a tunneling insulation layer), a charge trap layer, and a blocking insulation layer. For example, the charge storage layer CS may have an oxide-nitride-oxide (ONO) structure. Also, a gate electrode GE including the selection lines GSL and SSL and the word lines WL1 to WL8 may be provided on an exposed surface of the charge storage layer CS in a region between two adjacent common source lines CSL.

A plurality of drains or drain contacts DR may be respectively provided on the plurality of pillars P. For example, the drains or the drain contacts DR may include silicon doped with the second conductive type impurity. The first bit lines BL1_1 to BL1_3, which extend in the first horizontal direction HD1 and are spaced apart by a certain distance in the second horizontal direction HD2, may be provided on the drain contacts DR. The first bit lines BL1_1 to BL1_3 may be electrically connected to the drain contacts DR through contact plugs (not shown).

A word line cut region WLC extending in the second horizontal direction HD2 may be provided on the common source line CSL. The gate electrode GE may be divided into a plurality of portions by the word line cut region WLC. For example, the word line cut region WLC may include an insulating material, or may be an air gap.

Figure 4:
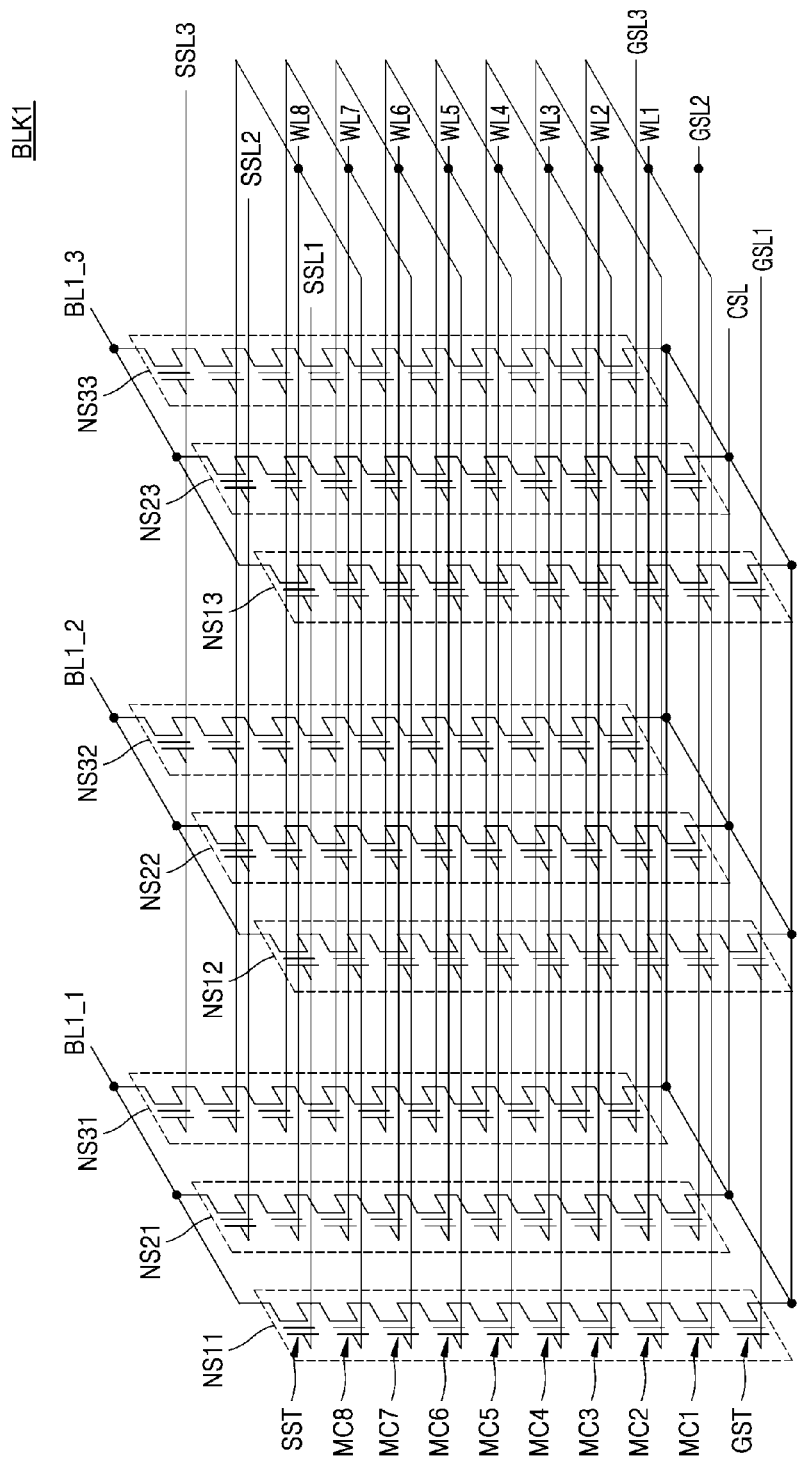
FIG. 4 is an equivalent circuit diagram for the first memory block of FIG. 3.

FIG. 4 is a partial, equivalent circuit diagram for the first memory block BLK1 of FIG. 2A.

Referring to FIG. 4, the first memory block BLK1 is assumed to be a NAND flash memory having a vertical structure. Any one or all of the plurality of blocks BLK1 to BLKz of FIG. 1 may be implemented according to the circuit diagram of FIG. 4. However, consistent the description of FIG. 3, the first memory block BLK1 may include NAND cell strings NS11 to NS33, first to eighth word lines WL1 to WL8, first to third bit lines BL1_1 to BL1_3, ground selection lines GSL1 to GSL3, string selection lines SSL1 to SSL3, and a common source line CSL. Although as previously noted, the number of NAND cell strings, word lines, bit lines, ground selection lines, and string selection lines may vary with overall design of the memory device 100.

The NAND cell strings NS11, NS21, and NS31 may be provided between the 1_1$^{th}$ bit line BL1_1 and the common source line CSL, the NAND cell strings NS12, NS22, and NS32 may be provided between the 1_2$^{th}$ bit line BL1_2 and the common source line CSL, and the NAND cell strings NS13, NS23, and NS33 may be provided between the 1_3$^{th}$ bit line BL1_3 and the common source line CSL. Each (for example, NS11) of the NAND cell strings NS11 to NS33 may include a string selection transistor SST, a plurality of memory cells MC1 to MC8, and a ground selection transistor GST, which are serially connected to one another.

NAND cell strings connected to one bit line in common may configure one column. For example, the NAND cell strings NS11, NS21, and NS31 connected to the 1_1$^{th}$ bit line BL1_1 may correspond to a first column, the NAND cell strings NS12, NS22, and NS32 connected to the 1_2$^{th}$ bit line BL1_2 may correspond to a second column, and the NAND cell strings NS13, NS23, and NS33 connected to the 1_3$^{th}$ bit line BL1_3 may correspond to a third column.

NAND cell strings connected to one string selection line may configure one row. For example, the NAND cell strings NS11, NS21, and NS31 connected to the first string selection line SSL1 may correspond to a first row, the NAND cell strings NS12, NS22, and NS32 connected to the second string selection line SSL2 may correspond to a second row, and the NAND cell strings NS13, NS23, and NS33 connected to the third string selection line SSL3 may correspond to a third row.

The string selection transistor SST may be connected to the string selection lines SSL1 to SSL3 corresponding thereto. Each of the plurality of memory cells MC1 to MC8 may be connected to a corresponding word line of the word lines WL1 to WL8. The ground selection transistor GST may be connected to the ground selection lines GSL1 to GSL3 corresponding thereto, and the string selection transistor SST may be connected to the first bit lines BL1_1 to BL1_3 corresponding thereto. The ground selection transistor GST may be connected to the common source line CSL.

In the present embodiment, word lines (for example, WL1) having the same height may be connected to one another in common, the string selection lines SSL1 to SSL3 may be separated from one another, and the ground selection lines GSL1 to GSL3 may be separated from one another. For example, in a case where memory cells included in the NAND cell strings NS11, NS12, and NS13 which are connected to the first word line WL1 and correspond to the first column are programmed, the first word line WL1 and the first string selection line SSL1 may be selected. However, the inventive concept is not limited thereto. In other embodiments, the ground selection lines GSL1 to GSL3 may be connected to one another in common.

Figure 5:
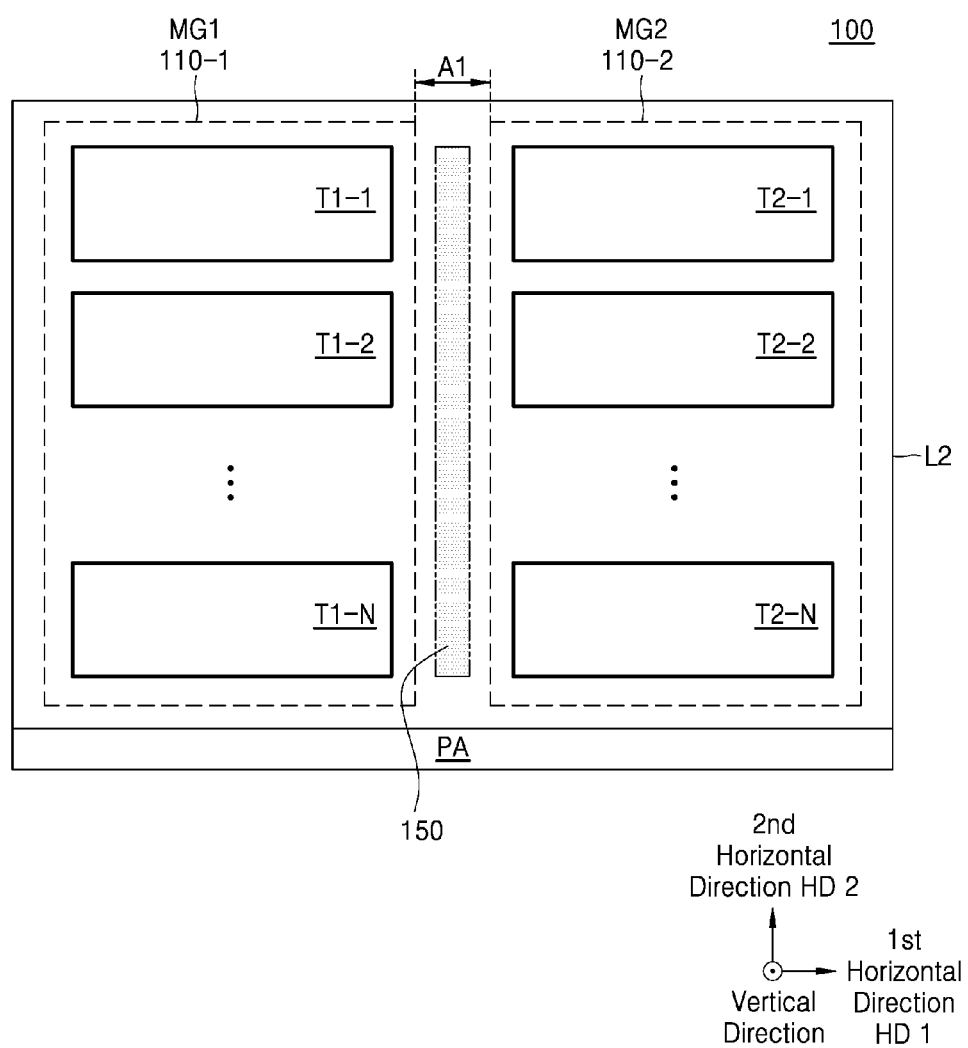
FIG. 5 is a top down view of a non-volatile memory device according to an embodiment of the inventive concept.

FIG. 5 is a top view of one example of the memory device 100 of FIG. 1 according to certain embodiments of the inventive concept.

Referring to FIG. 5, a first memory group MG1 (e.g., the first memory cell array 110-1) and a second memory group MG2 (e.g., the second memory cell array 110-2) are physically separated and electrically isolated by the separation region A1 extending in the second horizontal direction HD2 and vertically down through the upper semiconductor layer L2. The first memory group MG1 includes a first set of tiles (e.g., T1-1 to T1-N tiles, where 'N' is a positive integer, and the second memory group MG2 includes a second set of tiles (e.g., T2-1 to T2-N). In certain embodiments of the inventive concept, each tile in the first set of tiles and each tile in the second set of tiles may incorporate a memory cell array including one or more memory blocks. Thus, in certain embodiments of the inventive concept there may be a one-for-one relationship between tiles and memory cell arrays, but this need not always be the case.

In FIG. 5, a pad area PA is shown. Multiple connection pads provided by the pad area PA may be variously connected to external signal lines or wiring components. As previously described, the pad area PA may be provided in conjunction with a lower semiconductor layer L1 and/or an upper semiconductor layer L2. In FIG. 5, the pad area is shown extending along an entire length (e.g., in the first horizontal direction) of the memory device 100, but this is merely a convenient example. One or more pad areas PA may be provided, wholly or in part, along one or more outer edges of the memory device 100 in order to facilitate connection with external signal lines, wiring components, integrated circuits, etc. that variously communicate signals to/from the memory device 100.

Figure 6A:
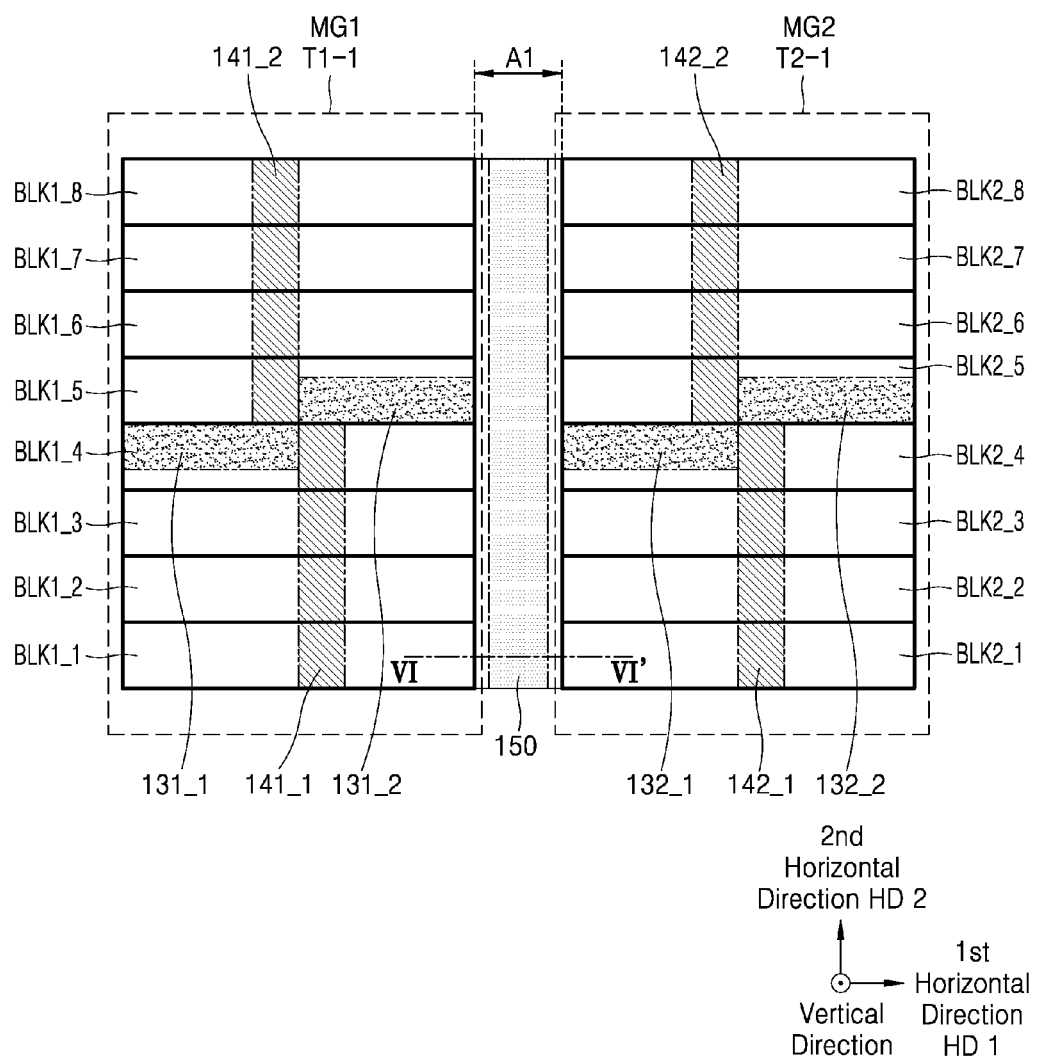
FIG. 6A is another top down view of a non-volatile memory device according to an embodiment of the inventive concept.
Figure 6B:
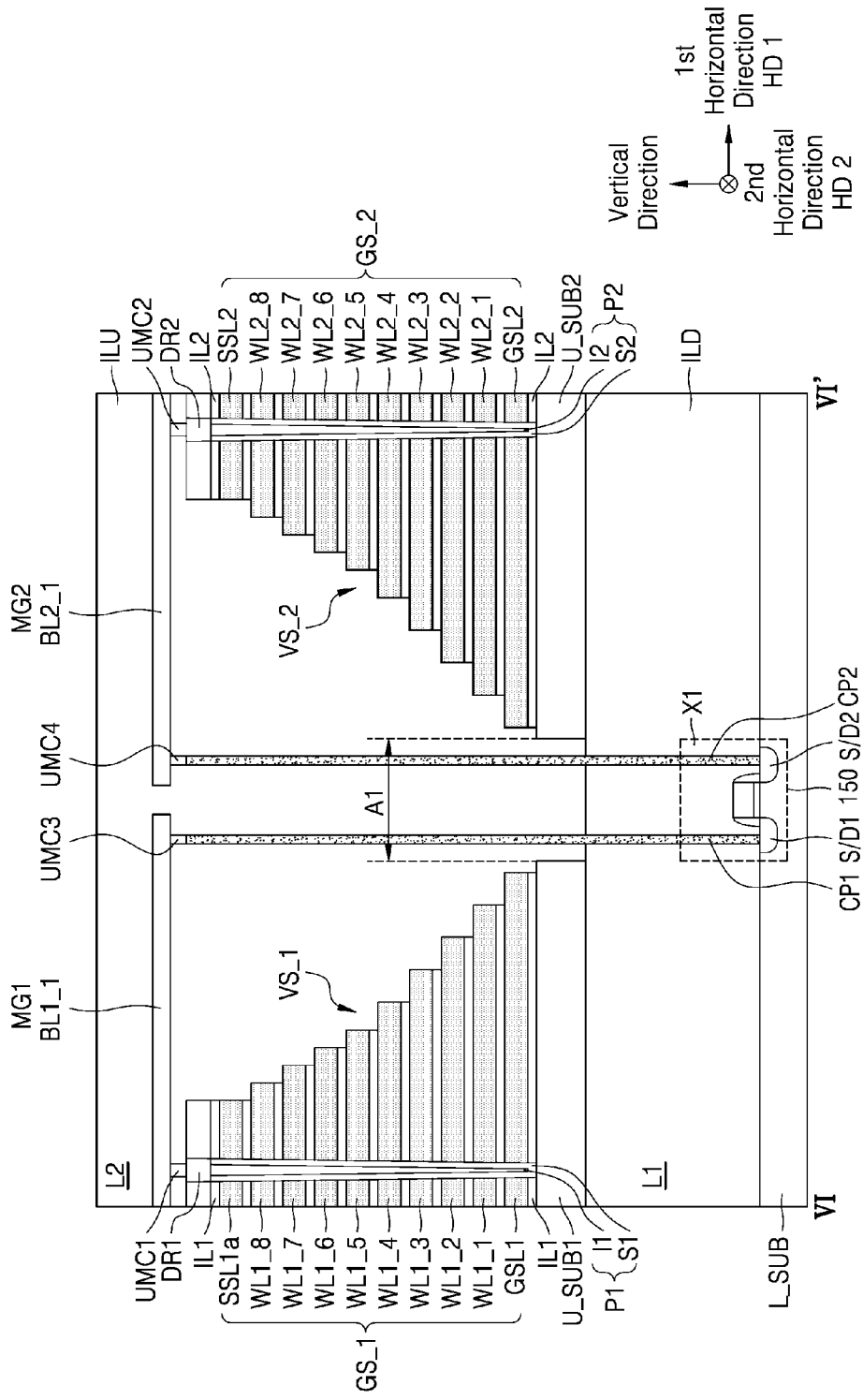
FIGS. 6B, 6C and 12 are cross-sectional diagrams variously illustrating possible configurations for embodiments of the inventive concept as seen from a perspective taken along the marked line VI-VI' of FIG. 6A.
Figure 6C:
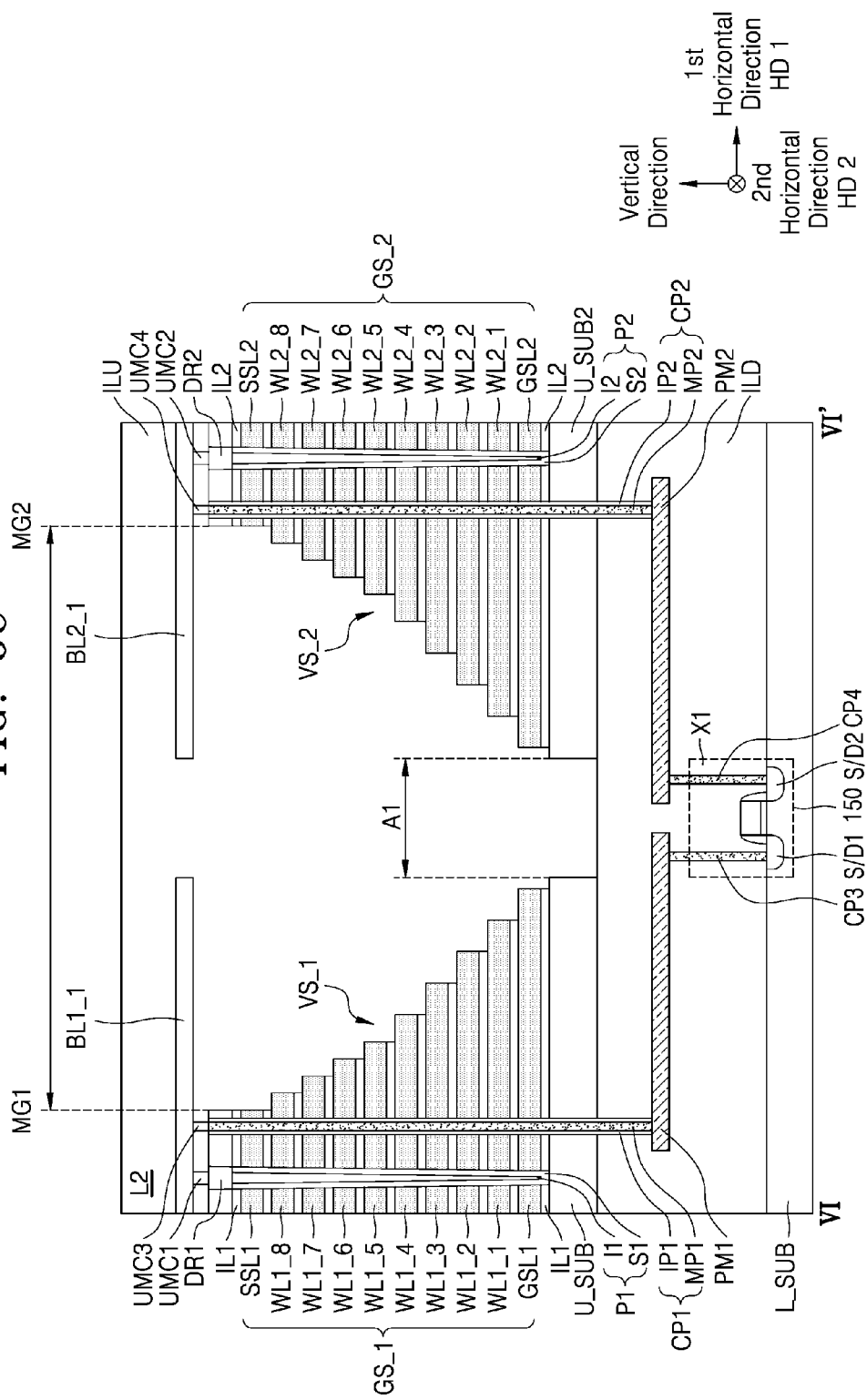

FIG. 5 is a top down view conceptually illustrating an upper surface of the upper semiconductor layer L2, and in particular illustrating the possibility of a multiple tile relationship between the first memory group MG1 and the second memory group MG2. In contrast, FIG. 6A is another top down view conceptually illustrating features of both the upper semiconductor layer L2 and the lower semiconductor layer L1. In FIG. 6A for the sake of descriptive simplicity, the first memory group MG1 is assumed to include a single first tile T1-1 and the second memory group MG2 is assumed to include a single second tile T2-1, where each one of the first file T1-1 and the second tile T2-1 includes eight (8) memory blocks. FIGS. 6B and 6C are respective cross-sectional views taken along the line VI-VI' marked in FIG. 6A.

Referring to FIG. 6A, the first memory blocks BLK1_1 to BLK1_8 of the first memory group MG1 and the second memory blocks BLK2_1 to BLK2_8 of the second memory group MG2 are disposed in the upper semiconductor layer L2 of FIG. 2A. The first memory blocks BLK1_1 to BLK1_8 and second memory blocks BLK2_1 to BLK2_8 are illustrated as being sequentially arranged in the second horizontal direction HD2, but this is just one example of many different memory block arrangements that may be used in embodiments of the inventive concept.

The embodiment illustrated in FIG. 6A also shows one possible arrangement of certain peripheral circuits disposed in the lower semiconductor layer L1 that underlies the memory groups (e.g., MG1 and MG2) of the upper semiconductor layer L2. For example, a first row decoder 131_1, a first page buffer 141_1, a second row decoder 131_2, and a second page buffer 141_2 may be disposed in a windmill pattern in the lower semiconductor layer L1 underlying the first memory group MG1. In like manner, a second first row decoder 132_1, a first page buffer 142_1, a second row decoder 132_2, and a second page buffer 142_2 may be disposed in a windmill pattern in the lower semiconductor layer L1 underlying the second memory group MG1.

In this arrangement, the row decoder associated with (e.g.,) memory cells of the first memory group MG1 may be divided into two portions (e.g., first row decoder 131_1 and second row decoder 131_2) and arranged in the windmill pattern. The same approach may be used for the page buffer associated with (e.g.,) memory cells of the first memory group MG1, the row decoder associated with (e.g.,) memory cells of the second memory group MG2 and the page buffer associated with (e.g.,) memory cells of the second memory group. Those skilled in the art will recognize that the division of certain peripheral circuits (e.g., driving circuits like the row decoder and page buffer) and rearrangement of the resulting portions of the peripheral circuitry into a windmill pattern underlying the corresponding memory group reduces the lateral (or horizontal) area required to accommodate the respective memory groups (or tiles) and the memory device 100 as a whole.

FIG. 6A also shows the disposition of the separation region A1 between the first memory group MG1 and the second memory group MG2 in the upper semiconductor layer L2. As will be described in some additional detail hereafter, certain embodiments of the inventive concept provide that at least a portion of the bypass circuit 150 be disposed in a portion of the lower semiconductor layer L1 underlying the separation region A1.

Thus, in the context of the embodiment illustrated in FIG. 6A, the bypass circuit 150 may be used to selectively connect memory cells of the first memory group MG1 with memory cells of the second memory group MG2 through the bypass circuit 150 in order to internally transfer data stored in the memory cells of the first memory group MG1 to the memory cells of the second memory group MG2. This transfer of data between memory groups otherwise electrically isolated by the separation region A1 may be controlled by the control logic 120 of FIG. 1 in response to one or more control signals provided to the bypass circuit 150.

Referring now to the cross-sectional view of FIG. 6B, the lower semiconductor layer L1 may include a lower (or principal) substrate L_SUB and the bypass circuit 150 disposed on the lower substrate L_SUB. Here, the bypass circuit 150 is assumed to include a transistor X1 including a first source/drain S/D1 and a second source/drain S/D2. A first contact plug CP1 extends vertically from the first source/drain S/D1 of the transistor X1 through the lower semiconductor layer L1 and the overlying portion of the upper semiconductor layer L1 to contact a first bit line BL1_1. A second contact plug CP2 extends vertically from the second source/drain S/D2 of the transistor X1 through the lower semiconductor layer L1 and the overlying portion of the upper semiconductor layer L1 to contact a second bit line BL2_1. Further, the gate of the transistor X1 may be connected to one or more control signal line(s) connecting (e.g.,) the control logic 120 which may provide the connection control signal CTRL_CN. With this configuration, the bypass circuit 150 may be used to internally bypass, in response to control signal(s) provided by the control logic 120, the separation region A1 disposed between the first memory group MG1 and the second memory group MG2. In the particular embodiment illustrated in FIG. 6B, the bypass circuit 150 is substantially disposed in a portion of the lower semiconductor layer L1 underlying the separation region A1.

With respect to the embodiment illustrated in FIG. 6B, the lower substrate L_SUB may be a semiconductor substrate including a semiconductor material such as single crystalline Si or polycrystalline Ge and may be manufactured from a Si wafer.

The upper semiconductor layer L2 may include a first upper (or secondary) substrate U_SUB1, a second upper (or secondary) substrate U_SUB2, a first vertical structure VS_1 disposed on the first upper substrate U_SUB1, and a second vertical structure VS_2 disposed on the second upper substrate U_SUB2. The first vertical structure VS_1 may include a gate conductive layer GS_1 and an insulation layer IL1 disposed on or under the gate conductive layer GS_1, and the second vertical structure VS_2 may include a gate conductive layer GS_2 and an insulation layer IL2 disposed on or under the gate conductive layer GS_2. Hereafter, the description of the first vertical structure VS_1 and the second vertical structure VS_2 will not repeat the description of elements already provided in relation to the memory block BLK1 of FIG. 3.

The upper semiconductor layer L2 may include a first upper contact UMC1 and the first bit line BL1_1 which are electrically connected to the first vertical structure VS_1. Also, the upper semiconductor layer L2 may include a second upper contact UMC2 and the second bit line BL2_1 which are electrically connected to the second vertical structure VS_2. The upper semiconductor layer L2 may include a third upper contact UMC3 electrically connected to the first bit line BL1_1, a fourth upper contact UMC4 electrically connected to the second bit line BL2_1, a portion of the first contact plug CP1, and a portion of the second contact plug CP2. The upper semiconductor layer L2 may include an upper insulation layer ILU which covers a portion of each of the first and second vertical structures VS_1 and VS_2, the first and second bit lines BL1_1 and BL2_1, the first to fourth upper contacts UMC1 to UMC4, and the first and second contact plugs CP1 and CP2.

The first upper substrate U_SUB1 may be a supporting element for the first gate conductive layer GS_1, and the second upper substrate U_SUB2 may be a supporting element for the second gate conductive layer GS_2. Therefore, each of the first upper substrate U_SUB1 and the second upper substrate U_SUB2 may be referred to as a base substrate.

In the illustrated embodiment of FIG. 6B, the separation region A1 extends between at least the first upper substrate U_SUB1 and the second upper substrate U_SUB2 and vertically down through the upper semiconductor layer L2. Thus, the separation region A1 may in certain embodiments of the inventive concept be a region that is vertically disposed through the entire vertical depth of the upper semiconductor layer L1 and extends laterally between at least the first upper substrate U_SUB1 and the second upper substrate U_SUB2.

The bypass circuit 150 may be electrically connected to the first bit line BL1_1 through the first contact plug CP1 which extends vertically through the upper insulation layer ILU and at least a portion of the lower insulation layer ILD. The bypass circuit 150 may also be electrically connected to the second bit line BL2_1 through the second contact plug CP2 which similarly extends vertically through the upper insulation layer ILU and at least a portion of the lower insulation layer ILD. In the illustrated embodiment of FIG. 6B, the first contact plug CP1 and the second contact plug CP2 extend vertically upward through the separation region A1 (e.g., a portion of the upper insulation layer ILU between the first upper substrate U_SUB1 and the second upper substrate U_SUB2.

With this configuration, the bypass circuit 150 may be used to selectively connect the first and second bit lines BL1_1 and BL2_1 in response to a control signal provided by the control logic 120.

The cross-sectional view shown in FIG. 6C is presented as one possible alternative to the embodiment shown in FIG. 6B and may be considered in relation to the foregoing description of FIGS. 6A and 6B. The particular embodiment illustrated in FIG. 6C differs from the embodiment of FIG.

6B primarily in the location of the first contact plug CP1 and second contact plug CP2. That is, instead of extending vertically upward through the separation region A1, the first contact plug CP1 extends vertically upward through a region including a first vertical structure region VS_1 and the second contact plug CP2 extends vertically upward through a region including a second vertical structure region VS_2. In the illustrated embodiment of FIG. 6C, the first vertical structure region VS_1 includes the first word lines WL1_1 through WL1_8 and overlies the first upper substrate U_SUB1, and the second vertical structure region VS_2 includes the second word lines WL2_1 through WL2_8 and overlies the second upper substrate U_SUB2. Thus, the first contact plug CP1 may extend vertically upward through a plurality of first gate conductive layers GSa_1, and the second contact plug CP2 may extend vertically upward through a plurality of second gate conductive layers GS_2.

The vertically disposed first contact plug CP1a may include a first conductive pattern MP1 surrounded by a first insulation layer IP1, and the second contact plug CP2a may include a second conductive pattern MP2 surrounded by a second insulation layer IP2a.

An upper end of the first contact plug CP1 may be electrically connected to the first bit line BL1_1 through a third upper contact UMC3 and a lower end of the vertically disposed first contact plug CP1 may be electrically connected to a laterally disposed first conductive line PM1. In like manner, an upper end of the second contact plug CP2 may be electrically connected to the second bit line BL2_1 through a fourth upper contact UMC4 and a lower end of the vertically disposed second contact plug CP2 may be electrically connected to a laterally disposed second conductive line PM2.

As may be seen from the illustrated example of FIG. 6C, the laterally disposed first conductive line PM1 and second conductive line PM2 may be used to laterally position the first contact plug CP1 and second contact plug CP2 within the overall structure of the memory device 100. For example, the first conductive line PM1 may be disposed between the first contact plug CP1 and a third contact plug CP3 and the second conductive line PM2 may be disposed between the second contact plug CP2 and a fourth contact plug CP4, where the third contact plug CP3 connects the first source/drain S/D1 of the transistor X1 and the fourth contact plug CP4 connects the second source/drain S/D2 of the transistor X1.

The contact plug arrangement illustrated in the embodiment of FIG. 6C may be particularly useful in circumstances wherein the separation region A1 is relatively narrow. Thus, the bypass circuit 150 may be provided in a region of the lower semiconductor layer L1 substantially underlying the separation region A1 even when the separation region A1 is not sufficiently width to accommodate the first contact plug CP1 and the second contact plug CP2.

As with the previously described embodiments, the memory device of FIG. 6C may effectively be used to internally transfer data between memory cells of a first memory group MG1 and memory cells of a second memory group MG2 through the bypass circuit 150 which selectively connects one or more first bit lines BL1 of the first memory group MG1 with one or more second bit lines BL2 of the second memory group MG2. This capability enhances memory device performance while reducing the overall lateral footprint of the memory device 100. It should be noted here, that various contact plug and conductive line arrangements may be used to relation to the windmill pattern arrangement of peripheral circuitry (e.g., row decoder(s) and page buffer(s)) in the lower semiconductor layer L1, like the one illustrated in FIG. 6A.

Figure 7:
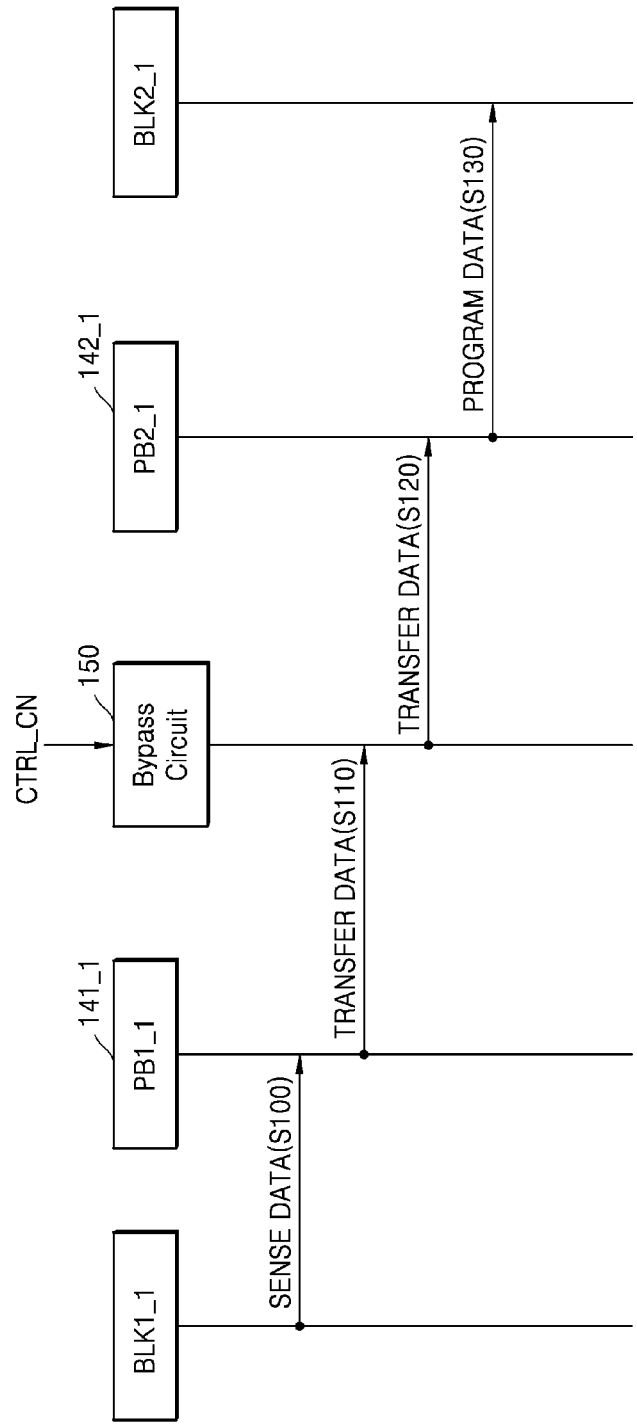
FIGS. 7 and 8 are operational diagrams illustrating possible methods of operating a non-volatile memory device according to embodiments of the inventive concept.

FIG. 7 is an operational diagram further illustrating in one embodiment the internal transfer of data between different memory groups of a memory device according to embodiments of the inventive concept. Here, the internal data transfer operation of FIG. 7 will be described in the context of the memory device previously described in relation to FIGS. 1, 6A and 6B. That is, the internal data transfer operation of FIG. 7 may be used to transfer data stored in memory cells of a first memory block BLK1_1 of the first memory group MG1 to memory cells of a first memory block BLK2_1 of the second memory group MG2 through the bypass circuit 150.

Hence, referring to FIGS. 1, 6A, 6B and 7, data stored in the first memory block BLK1_1 of the first memory group MG1 may be selected in response to an externally provided command CMD, address ADDR, and/or control signal CTRL. As a result, the selected data may be read (or sensed) by applying appropriate voltages to the first memory block BLK1 of the first memory group MG1 (e.g., one or more word line voltage(s) and/or bit line voltage(s)) (S100). As will be appreciated by those skilled in the art, the data read operation S100 may be accomplished in certain embodiments of the inventive concept by executing a normal read operation directed to one or more selected memory cells of the first memory group MG1. In this context, the term "normal" means a read operation regularly performed by the memory device 100 to read (or sense) data from selected memory cells of the first memory group MG1 and temporarily store the sensed data in a corresponding first page buffer PB1_1.

Thus, as a result of the data sensing operation S100, data stored in the selected memory cells of the first memory group MG1 may be temporarily stored in a first page buffer PB1_1 (e.g., page buffer 140 in FIG. 1 or the first page buffer 141_1 and/or 141_2 in FIG. 6A). The data temporarily stored in the first page buffer PB1_1 may be transferred to the bypass circuit 150 (S110) under the control of the control logic 120. For example, the data transfer-in operation may be accomplished by selectively connecting the bypass circuit 150 with one or more bit lines BL1 of the first memory group MG1 in response to the connection control signal CTRL_CN. In this regard, the data temporarily stored in the first page buffer PB1_1 may be simultaneously stored in the bypass circuit 150—acting as a data latch in certain embodiments of the inventive concept—while the data is being read (or sensed) from the selected memory cells of the first memory group MG1 by selectively connecting the bypass circuit 150 to first bit line(s) of the first memory group MG1. In this context, the term "simultaneously" means the reading (sensing) of the data occurs with at least some temporal overlap with the storing (or latching) of the data in the bypass circuit 150. Alternately, the data may be passed from the first page buffer PB1_1 to the bypass circuit 150 after being temporarily stored in the first page buffer PB1_1 using first bit line connection(s) between the bypass circuit 150 and the first page buffer PB1_1 controlled by the connection control signal CTRL_CN.

Once the data has been transferred to the bypass circuit 150, it may be transferred out of the bypass circuit 150 to a second page buffer PB2_1 associated with the second memory group MG2 (e.g., the page buffer 140 of FIG. 1 or second page buffer 142_1 and/or 142_2 in FIG. 6A.) (S120). Here, the data stored in the bypass circuit 150 may be passed from the bypass circuit 150 to the second page buffer PB2_1 using second bit line connection(s) between the bypass circuit 150 and the second page buffer PB2_1 controlled by the connection control signal CTRL_CN.

Once the data has been transferred from the bypass circuit 150 to the second page buffer PB2_1, the data may be programmed from the second page buffer PB2_1 to selected memory cells of the second memory group MG2 (S130). As will be appreciated by those skilled in the art, the data programming S130 may be accomplished in certain embodiments of the inventive concept by executing a normal program operation directed to one or more selected memory cells of the second memory group MG2. In this context, the term "normal" means a program operation regularly performed in the memory device 100 to program data temporarily stored in the second page buffer PB2_1 to selected memory cells of the second memory group MG2.

Figure 8:
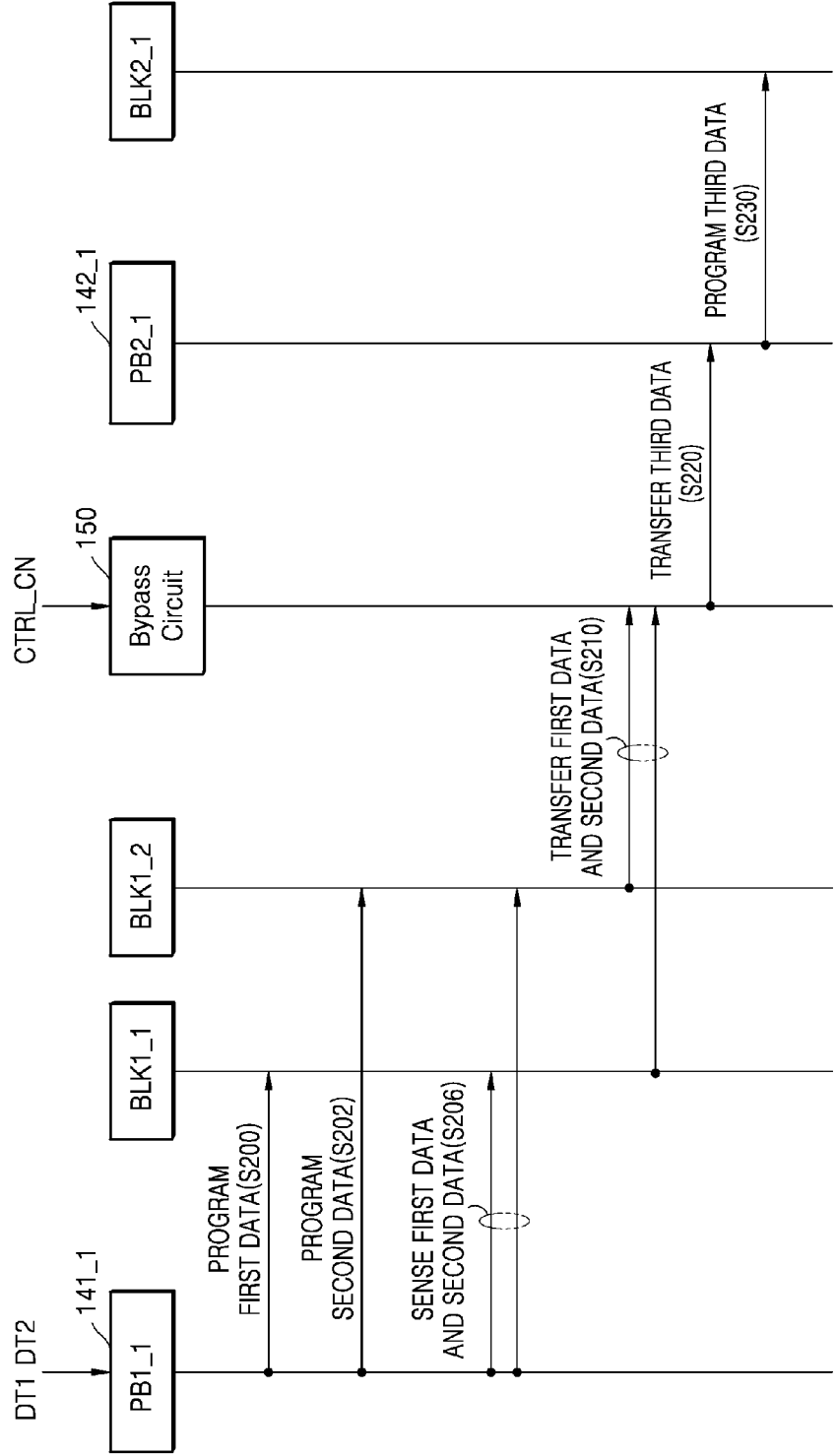

FIG. 8 is another operational diagram further illustrating in one embodiment the internal accumulation and transfer of data between different memory groups of a memory device according to embodiments of the inventive concept. Here again, internal accumulation and transfer of data operation of FIG. 8 will be described in the context of the memory device previously described in relation to FIGS. 1, 6A and 6B. That is, the internal accumulation and transfer of data shown in FIG. 8 may be used to transfer data stored in memory cells of a first memory block BLK1_1 and memory cells of a second memory block BLK1_2 of the first memory group MG1 to memory cells of a first memory block BLK2_1 of the second memory group MG2 through the bypass circuit 150.

In FIG. 8, it is assumed that first data DT1 are programed to the first memory block BLK1_1 and second data DT2 are programmed to the second memory block BLK1_2 of the first memory group MG1 using the first page buffer PB1_1. Two separate programming operations S200 and S202 may be used to program the first data DT1 and second date DT2 in the first memory group MG1. That is, the first page buffer PB1_1 may receive the first data DT1 and the second data DT2, program the first data DT1 in the first memory block BLK1_1 during in a first program operation S200, and program the second data DT2 in the second $2^{th}$ memory block BLK1_2 during a second operation S202. Here, the programming of the first data DT1 and programming of the second data DT2 may be performed simultaneously or sequentially.

Subsequently, the first page buffer PB1_1 may be used to respectively read (or sense) the first data DT1 from the first memory block BLK1_1 and the second data DT2 from the second memory block BLK1_2 (S206). For example, the first page buffer PB1_1 may be electrically connected to the first memory block BLK1_1 and the second memory block BLK1_2 of the first memory group MG1 using different first bit lines, and may apply appropriate sensing voltage(s) to the first memory block BLK1_1 and the second memory block BLK1_2 through these different first bit lines.

Subsequently, the first data DT1 read from the first memory block BLK1_1 and the second data DT2 read from the second memory block BLK1_2 may be transferred to the bypass circuit 150 in response to one or more control signals (e.g., the connection control signal CTRL_CN provided by the control logic 120). Here again, the first data DT1 and the second data DT2 may be transferred to the bypass circuit 150 through different first bit lines.

Once the first data DT1 and the second data DT2 have both been read and accumulated in the bypass circuit 150, a combination of the first data DT1 and the second data DT2—or third data DT3, may be transferred from the bypass circuit 150 to the second page buffer PB2_1 (S220) as a unitary data block, for example. And once temporarily stored in the second page buffer PB2_1, the third data DT3 may be programmed to the first memory block BLK2_1 of the second memory group MG2 (S230).

In the accumulate and transfer operation of FIG. 8, the bypass circuit 150 may be variously connected to first bit lines BL1 of the first memory group and subsequently to the second bit lines BL2 of the second memory group MG2 in response to one or more control signals provided (e.g.,) from the control logic 120. In certain embodiments of the inventive concept, a accumulate and transfer operation performed between different memory groups through a bypass circuit may be used, for example, to transfer-in two or more SLC data blocks from one or more memory blocks of the first memory group MG1 to the bypass circuit 150, and thereafter transfer-out a single MLC data block (e.g., TLC data or QLC data) to a memory block of the second memory group MG2. In certain embodiments, the transfer-out of the MLC data may be performed as a single program operation (e.g., a normal program operation performed in response to a single program command) directed to selected MLC of the second memory group MG2.

In certain embodiments of the inventive concept, the first data DT1 and the second data DT2 may be different SLC pages stored in the first memory group MG1, while the third data DT3 may be a single MLC page stored in the second memory group. Indeed, data sets of varying size and definitions may be used in the context of the data transfer operations of FIGS. 7 and 8.

Figure 9:
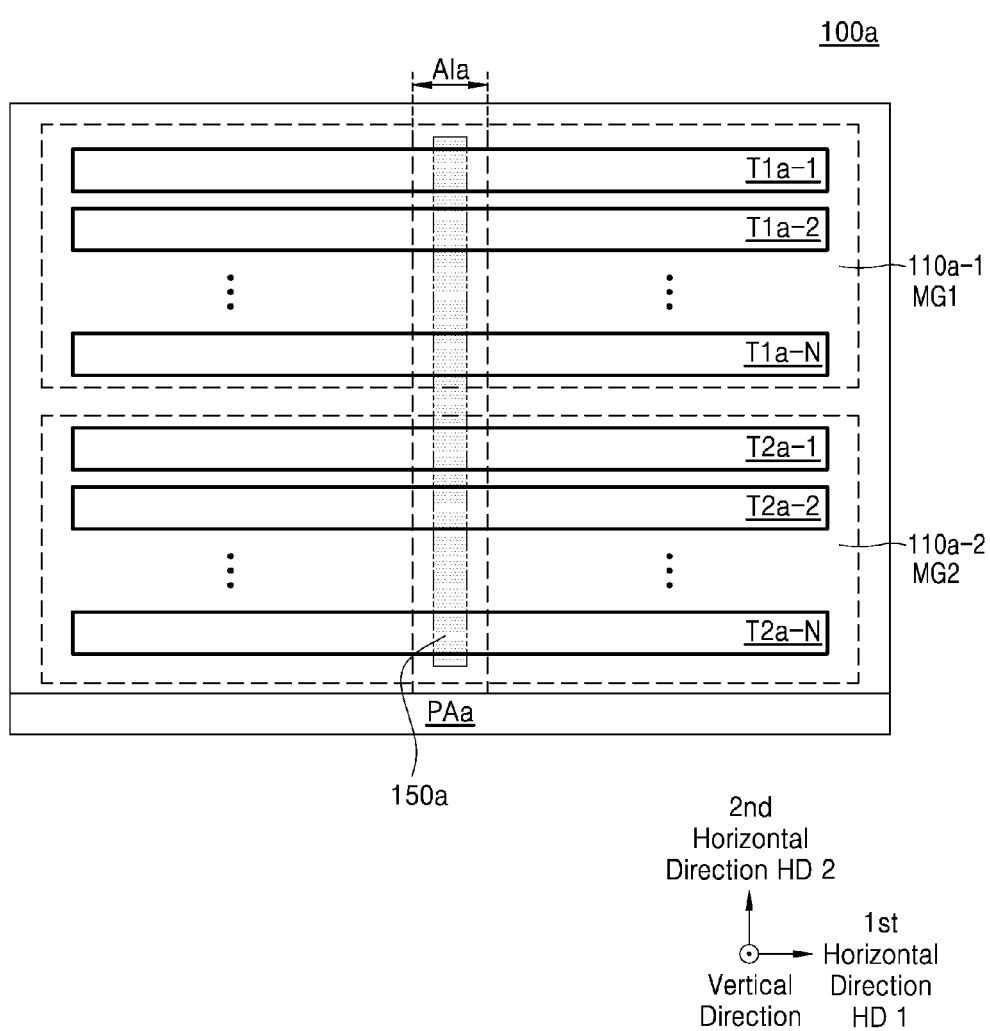
FIGS. 9, 10 and 11 are respective top down views a memory device according to embodiments of the inventive concept.

FIG. 9 is a top view of another memory device 100a according to an embodiment of the inventive concept. The memory device 100a of FIG. 9 may be compared with the memory device 100 previously described in relation to FIG. 5. Among other concepts and features, FIG. 5 described an exemplary arrangement of memory groups (e.g., MG1 and MG2) and an arrangement of constituent tiles (e.g., T1_1 through T1_N and T2_1 through T2_N) in each of the memory groups. FIG. 9 extends these teachings, and those skilled in the art will understand upon consideration of the embodiments illustrated in FIGS. 5 and 9 that different arrangements of memory groups and different arrangements of constituent tiles may be provided in various embodiments of the inventive concept.

Referring to FIG. 9, a first memory group MG1 (e.g., a first memory cell array 110a-1) and a second memory group MG2 (e.g., a second memory cell array 110a-2), as well as the constituent tiles of the first memory group MG1 and the second memory group MG2, extend laterally in the first horizontal direction HD1 substantially across the entire length of the memory device 100a and relative to a separation region A1a that extends in the second horizontal direction HD2. Despite the different relative geometries of the memory groups and tiles, the bypass circuit 150 may still be disposed in a region of the lower semiconductor layer L1 underlying the separation region A1a.

Figure 10:
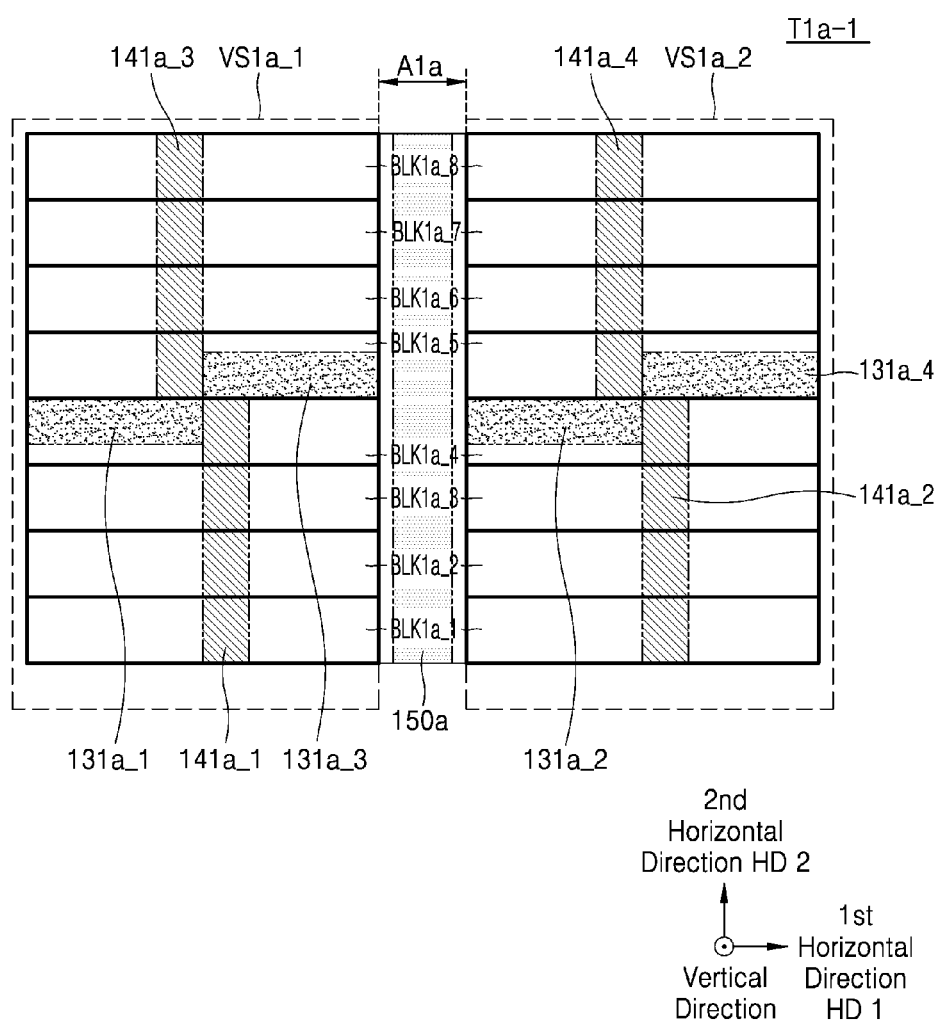

In this regard, FIG. 10 is a another top down view further illustrating in one embodiment an exemplary the tile T1a-1 of FIG. 9.

Referring to FIG. 10, the tile T1a-1 may include a plurality of first memory blocks (e.g., BLK1b_1 to BLK1b_8). Each of the first memory blocks BLK1b_1 to BLK1b_8 may be associated with a first vertical structure VS1a_1 and a second vertical structure VS1a_2. For example, a portion of the first vertical structure VS1a_1 and a portion of the second vertical structure VS1a_2 may be included in the first memory block BLK1a_1. The first vertical structure VS1a_1 and the second vertical structure VS1a_2 may respectively include gate conductive layers vertically stacked on corresponding upper substrates.

Although not shown, a plurality of bit lines may be disposed in the second horizontal direction HD2 along an upper portion of the first tile T1a-1. In certain embodiments of the inventive concept, a plurality of first bit lines may be disposed along an upper portion of the first vertical structure VS1a_1, and a plurality of second bit lines, different from and electrically isolated from the first bit lines, may be disposed along an upper portion of the second vertical structure VS1a_2.

With the foregoing configuration, some of the memory blocks BLK1a_1 to BLK1a_8 provided by the first vertical structure VS1a_1 may be electrically connected to a first page buffer 141a_1 or a third page buffer 141a_3 through the first bit lines. Some of the memory blocks BLK1b_1 to BLK1b_8 provided by the second vertical structure VS1a_2 may be electrically connected to a second page buffer 141a_2 or a fourth page buffer 141b_4 through the second bit lines.

For example, a portion of the first memory block BLK1a_1 may be connected to the first page buffer 141a_1 through a corresponding first bit line, and another portion thereof may be connected to the second page buffer 141a_2 through a corresponding second bit line. Therefore, the portion connected to the first page buffer 141a_1 of the memory block BLK1a_1, and the other portion connected to the second page buffer 141a_2 of the memory block BLK1b_1 may have the same block address, but different column addresses.

In the context of the illustrated embodiment of FIGS. 9 and 10, the separation region A1a may be defined between the first vertical structure VS1a_1 and the second vertical structure VS1a_2. For example, the separation region A1a may be a region extending from one upper substrate on which the first vertical structure VS1a_1 is stacked to another upper substrate on which the second vertical structure VS1a_2 is stacked. Hence, the relative width and location of a separation region (e.g., A1 and A1a) may vary with design of the memory groups in the upper semiconductor layer L2 of a memory device according to embodiments of the inventive concept.

In an embodiment, at least a portion of the bypass circuit 150b may be disposed to overlap the first region A1b in the third direction. For example, the bypass circuit 150b may electrically connect a first bit line and a second bit line disposed in the same memory block, based on control by a control logic (120 of FIG. 1). Accordingly, the memory device 100b may perform data movement in the same memory block (for example, BLK1b_1).

Figure 11:
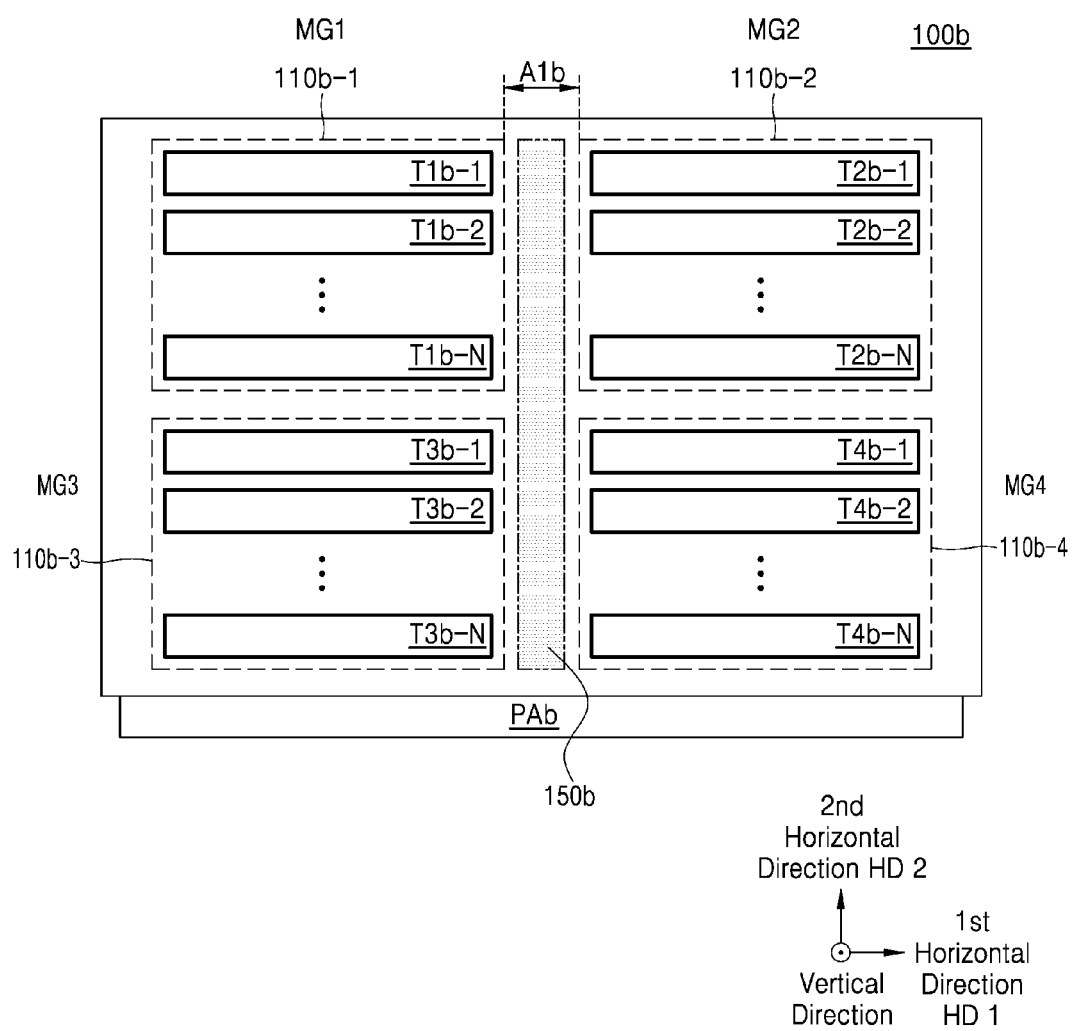

FIG. 11 is still another top down view of a memory device 100b according to an embodiment of the inventive concept, that may be considered in comparison with the embodiments illustrated in FIGS. 5 and 9.

Referring to FIG. 11, the memory device 100b may include a first memory group MG1 (e.g., first memory cell array 110b-1), a second memory group MG2 (e.g., second memory cell array 110b-2), a third memory group MG3 (e.g., third memory cell array 110b-3), and a fourth memory group MG4 (e.g., fourth memory cell array 110b-4). Here, the first memory group MG1 is horizontally adjacent to the second memory group MG2 in the first horizontal direction HD1, the third memory group MG3 is horizontally adjacent to the fourth memory group MG4 in the first horizontal direction HD1, the first memory group MG1 is horizontally adjacent to the third memory group MG3 in the second horizontal direction HD2, and the second memory group MG2 is horizontally adjacent to the fourth memory group MG4 in the second horizontal direction HD2.

However, the relationships described above between a separation region A1b, the bypass circuit 150 and a pad area PA may still hold regardless of the number and/or layout variations in memory groups included in the memory device 100b. Thus, in the context of the embodiment illustrated in FIG. 11, internal data transfers may be performed between any two or more of the first memory group MG1, second memory group MG2, third memory group MG3 and fourth memory group MG4 using a bypass circuit 150, where the operation of the bypass circuit may be controlled by one or more control signals provided (e.g.,) from the control logic 120 of FIG. 1.

Up to this point in the written description, certain illustrated embodiments of the inventive concept have assumed that the bypass circuit 150 is centrally disposed in a region of the lower semiconductor layer L1 that substantially underlies a relatively narrow separation region (e.g., A1 and A1a, A1b) defined in the upper semiconductor layer L2. However, the separation region need not always have such a narrow definition and the bypass circuit 150 may therefore be somewhat laterally offset relative to a central point between adjacent vertical structures, for example.

Figure 12:
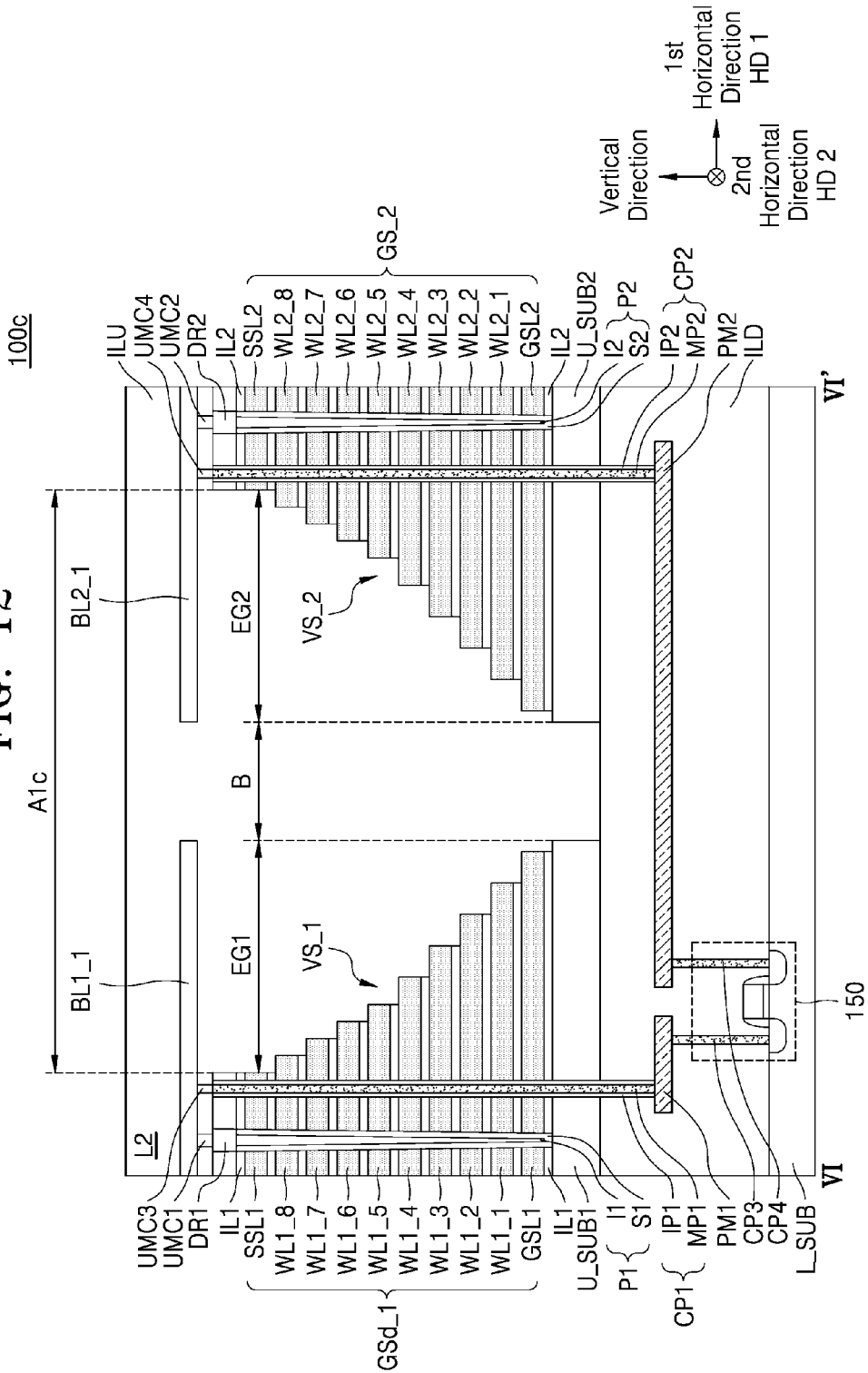

FIG. 12 is a cross-sectional view of a memory device 100c according to an embodiment of the inventive concept. Here, FIG. 12 is a cross-sectional view taken along the marked line VI-VI' of FIG. 6A, and the description of the embodiment illustrated in FIG. 12 may be considered in view of the description of the embodiment of FIG. 6B.

Referring to FIG. 12, the first vertical structure VS_1 includes a first edge region EG1 and the second vertical structure VS_2 includes a second edge region EG2, where each of the first and second edge regions EG1 and EG2 may have a stepped pad structure, or a so-called "word line pad". Although not shown, a plurality of edge contacts may contact the first and second edge regions EG1 and EG2, and the first and second vertical structures VS_1 and VS_2 may be supplied with electrical signal(s) from various peripheral circuitry (e.g., row decoder 130 of FIG. 1) through the edge contacts.

In the illustrated embodiment of FIG. 12, a separation region A1c is relatively broadly defined to include the first edge region EG1, the second edge region EG2, and a region B between a first upper substrate U_SUB1d and a second upper substrate U_SUB2d. Hence, the bypass circuit 150 may be provided anywhere in the lower substrate L_SUB so long as it vertically underlies, at least in substantial part, a portion of the separation region A1c. For example, as shown in FIG. 12, the bypass circuit 150 may be disposed towards the first edge region EG1 of the upper semiconductor layer L2. Alternatively, the bypass circuit 150d may be disposed towards the second edge region EG2.

Figure 13A:
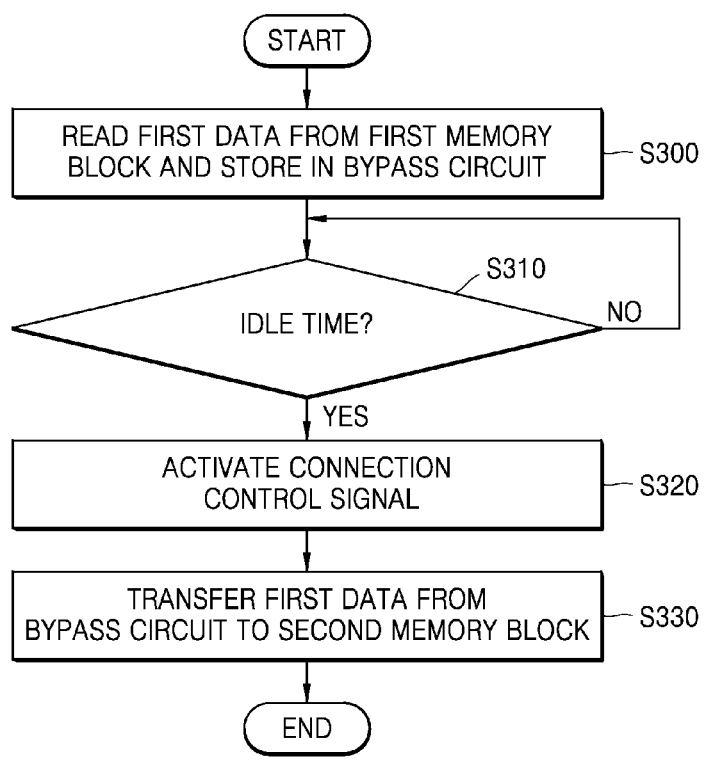
FIGS. 13A and 13B are flowcharts illustrating possible methods of operating a non-volatile memory device according to embodiments of the inventive concept.
Figure 13B:
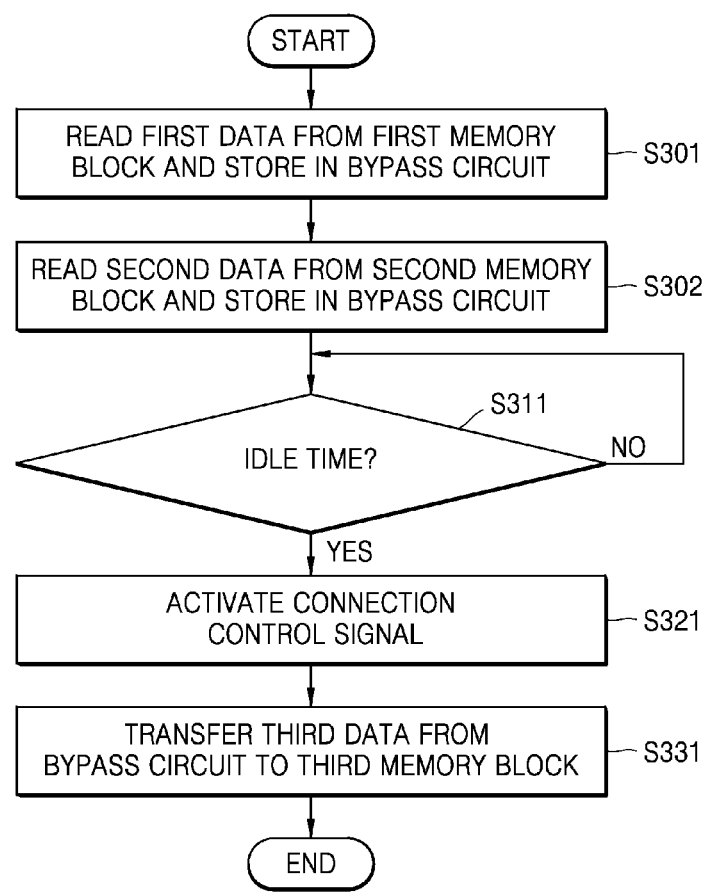

As has been described in relation to certain embodiments of the inventive concept, the bypass circuit 150 may be used to temporarily store data being internally transferred from one memory group to another memory group in a memory device. FIGS. 13A and 13B are respective flowcharts further illustrating methods by which the transfer-in/store/transfer-out functionality provided by the bypass circuit 150 may be used to further advantage.

The method illustrated in FIG. 13A may be considered in relation to the operational diagram of FIG. 7. Thus, a first block of data may be read (or sensed) from a first memory block (e.g., transferred-in) of a first memory group MG1 and stored in the bypass circuit 150 (S300). Then, instead of immediately transferring-out the stored first data from the bypass circuit, the control logic 120 of the memory device 100 may wait until an idle time is detected (S310). Once an idle time is detected in the operation of the memory device (S310=YES), the connection control signal provided to the bypass circuit 150 from the control logic 120 may be activated (S320), and the first data stored in the bypass circuit 150 may be transferred-out to a second memory block of a second memory group MG2 (S330).

The method illustrated in FIG. 13B may be considered in relation to the operational diagram of FIG. 8. Thus, first data may be read from a first memory block (S301), and second data may be read from a second memory block different from the first memory block (S302). The first memory block and the second memory block may be selected from any one of the memory groups of the memory device 100 (e.g., the first memory group MG1, second memory group MG2, third memory group MG3 and/or fourth memory groups MG4 of the embodiment illustrated in FIG. 11). Then, instead of immediately transferring-out the accumulated data (i.e., third data) stored in the bypass circuit, the control logic 120 of the memory device 100 may wait until an idle time is detected (S311). Once an idle time is detected in the operation of the memory device (S311=YES), the connection control signal provided to the bypass circuit 150 from the control logic 120 may be activated (S321), and the third data stored in the bypass circuit 150 may be transferred-out to a third memory block, where here again the third memory block may be located in any one of the memory groups of the memory device 100 (S331).

It has been previously noted that in the context of certain embodiments of the inventive concept, the connection control signal provided by the control logic 120 (or from another circuit like a processor or controller within the memory device 100) may take many different forms including digital conform signals, analog control signals, register signals and/or data packets. Given the range of signal types that the connection control signal may take, those skilled in the art will recognize that the connection control signal may be variously activated/deactivated. Hence, the term "activated" as used herein may be understood as a connection control signal definition (or transition) that causes a desired function in the bypass circuit 150. Common function in this regard may include turning a transistor ON or OFF, closing/opening a switch, causing a software routine to run or stop running, etc.

Figure 14:
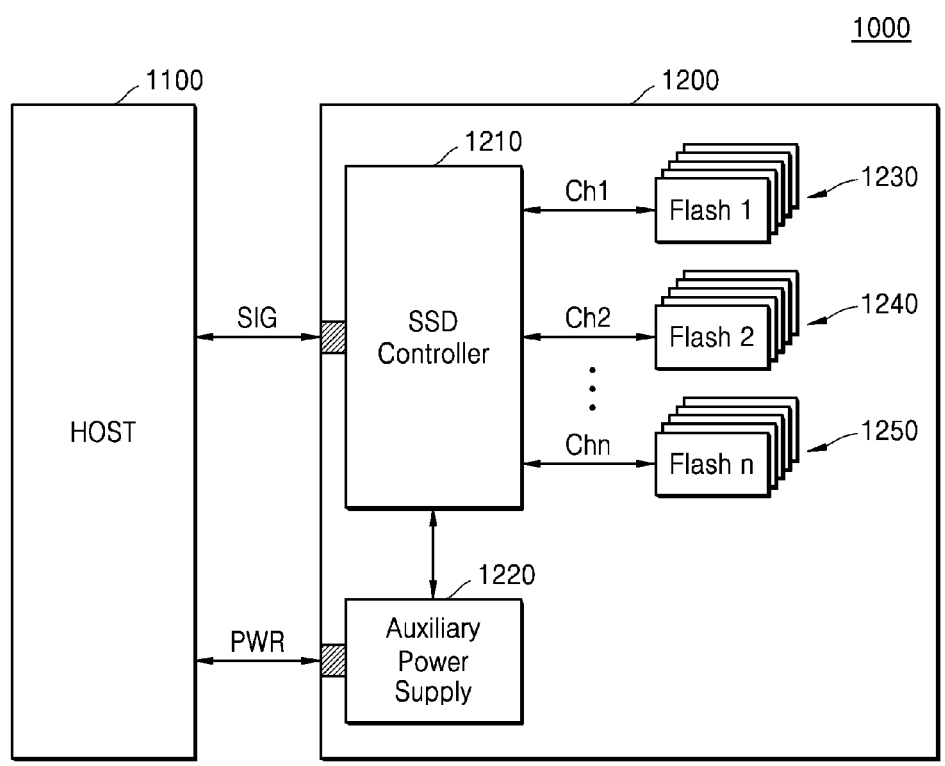
FIG. 14 is a block diagram illustrating a solid stage drive (SSD) system including one or more non-volatile memory device(s) according to the inventive concept.

FIG. 14 is a block diagram illustrating a solid stage drive (SSD) system 1000 that may include one or more memory device(s) according to embodiments of the inventive concept.

Referring to FIG. 14, the SSD system 1000 may include a host 1100 and an SSD 1200. The SSD 1200 may transfer or receive a signal to or from the host 1100 through a signal connector and may be supplied with a power through a power connector.

The SSD 1200 may include an SSD controller 1210, an auxiliary power supply 1220, and a plurality of memory devices 1230, 1240, and 1250. Each of the plurality of memory devices 1230, 1240, and 1250 may be a vertically stacked NAND flash memory device and may be implemented according to the embodiments described above with reference to FIGS. 1 to 13. Therefore, each of the memory devices 1230, 1240, and 1250 may be high in degree of integration and may perform various operations associated with data movement.

While the inventive concept has been particularly shown and described with reference to the foregoing illustrated embodiments, it will be understood by those skilled in the art that various changes in form and details may be made to the embodiments without departing from the spirit and scope of the following claims.

What is claimed is:

1. A non-volatile memory, comprising:
an upper semiconductor layer vertically stacked on a lower semiconductor layer, wherein the upper semiconductor layer includes a first memory group spaced apart from a second memory group in a first horizontal direction by a separation region,
the lower semiconductor layer includes a bypass circuit underlying at least a portion of the separation region and configured to selectively transfer data stored in the first memory group from a first bit line of the first memory group to a second bit line of the second memory group for storage of the data in the second memory group.

2. The non-volatile memory of claim 1, further comprising:
a control logic that generates a connection control signal, wherein the bypass circuit selectively connects the first bit line with the second bit line in response to the connection control signal.

3. The non-volatile memory of claim 1, wherein the bypass circuit includes a transistor including a first source/drain region and a second source/drain region, and
the non-volatile memory device further comprises:
a first contact plug extending from the first source/drain region through the separation region to connect the first bit line; and
a second contact plug extending from the second source/drain region through the separation region to connect the second bit line.

4. The non-volatile memory of claim 1, wherein a portion of the lower semiconductor layer underlying the first memory group includes a first portion of a first row decoder, a second portion of the first row decoder, a first portion of a first page buffer and a second portion of the first page buffer arranged in a first windmill pattern, and
another portion of the lower semiconductor layer underlying the second memory group includes a first portion of a second row decoder, a second portion of the second row decoder, a first portion of a second page buffer and a second portion of the second page buffer arranged in a second windmill pattern.

5. The non-volatile memory of claim 1, further comprising:
a lower substrate underlying the lower semiconductor layer;
a first upper substrate and a second upper substrate respectively disposed on an upper surface of the lower semiconductor layer,
wherein the separation region extends between the first upper substrate and the second upper substrate.

6. The non-volatile memory of claim 1, wherein the lower semiconductor layer further includes a control logic that generates a connection control signal, and the bypass circuit selectively connects the first bit line and the second bit line in response to the connection control signal.

7. The non-volatile memory of claim 1, wherein the lower semiconductor layer further includes a pad region disposed along at least a portion of at least one outer edge of the lower semiconductor layer.

8. The non-volatile memory of claim 1, wherein the bypass circuit includes a transistor having a first source/drain region and a second source/drain region, and the non-volatile memory device further comprises:
   a lower substrate underlying the lower semiconductor layer;
   a first upper substrate and a second upper substrate respectively disposed on an upper surface of the lower semiconductor layer, wherein the separation region extends between the first upper substrate and the second upper substrate;
   a first vertical structure disposed on the first upper substrate and including memory cells of the first memory group;
   a second vertical structure disposed on the second upper substrate and including memory cells of the second memory group;
   a first contact plug extending vertically upward through the first vertical structure to connect the first bit line;
   a second contact plug extending vertically upward through the second vertical structure to connect the second bit line;
   a third contact plug connecting the first source/drain region;
   a fourth contact plug connecting the second source/drain region;
   a first conductive line extending in the first horizontal direction and connecting the first contact plug and the third contact plug; and
   a second conductive line extending in the first horizontal direction and connecting the second contact plug and the fourth contact plug.

9. The non-volatile memory of claim 1, wherein the bypass circuit includes a transistor having a first source/drain region and a second source/drain region, and
the non-volatile memory device further comprises:
   a lower substrate underlying the lower semiconductor layer;
   a first upper substrate and a second upper substrate respectively disposed on an upper surface of the lower semiconductor layer;
   a first vertical structure disposed on the first upper substrate and including a first edge region and memory cells of the first memory group;
   a second vertical structure disposed on the second upper substrate and including a second edge region and memory cells of the second memory group, wherein the separation region extends between the first edge region and the second edge region;
   a first contact plug extending vertically upward through the first vertical structure to connect the first bit line;
   a second contact plug extending vertically upward through the second vertical structure to connect the second bit line;
   a third contact plug connecting the first source/drain region;
   a fourth contact plug connecting the second source/drain region;
   a first conductive line extending in the first horizontal direction and connecting the first contact plug and the third contact plug; and
   a second conductive line extending in the first horizontal direction and connecting the second contact plug and the fourth contact plug,
   wherein the bypass circuit is disposed in a portion of the first semiconductor layer underlying one of the first edge region and the second edge region.

10. A method for internally transferring data in a non-volatile memory including an upper semiconductor layer vertically stacked on a lower semiconductor layer, wherein the upper semiconductor layer includes a first memory group and a second memory group separated in a first horizontal direction by a separation region, and the lower semiconductor layer includes a bypass circuit underlying at least a portion of the separation region, the method comprising:
   sensing first data stored in a first memory block of the first memory group using a first page buffer associated with the first memory group and storing the first data in the bypass circuit;
   transferring the first data stored in the bypass circuit to a second page buffer associated with the second memory group; and
   programming the first data transferred to the second page buffer in a first memory block of the second memory group.

11. The method of claim 10, wherein the sensing of the first data stored in the first memory block of the first memory group and the storing of the first data in the first page buffer are performed simultaneously.

12. The method of claim 10, further comprising:
   after storing the first data in the bypass circuit, waiting until an idle time for the non-volatile memory device is detected and then transferring the first data stored in the bypass circuit to the second page buffer.

13. The method of claim 10, wherein the first page buffer is disposed in a portion of the lower semiconductor layer underlying the first memory group, and the second page buffer is disposed in the lower semiconductor layer underlying the second memory group.

14. The method of claim 10, wherein the sensing of the first data stored in the first memory block of the first memory group includes selecting at least one first word line of the first memory group using a first row decoder, and
   the programming of the first data transferred to the second page buffer in the first memory block of the second memory group includes selecting at least one second word line of the second memory group using a second row decoder.

15. The method of claim 10, wherein the first row decoder is disposed in a portion of the lower semiconductor layer underlying the first memory group, and the second row decoder is disposed in the lower semiconductor layer underlying the second memory group.

16. The method of claim 10, wherein the non-volatile memory further includes control logic generating a connection control signal applied to the bypass circuit, and the method further comprises:
   activating the connection control signal when storing of the first data in the bypass circuit; and
   activating the connection control signal when transferring the first data stored in the bypass circuit to the second page buffer.

17. The method of claim 10, further comprising:
   sensing second data stored in a second memory block of the first memory group using the first page buffer and storing the second data together with the first data in the bypass circuit;
   transferring the second data stored in the bypass circuit together with the first data stored in the bypass circuit to the second page buffer; and
   programming the first data together with the second data transferred to the second page buffer in the second memory group as a unitary block of data.

18. In a non-volatile memory device including a control logic, an upper semiconductor layer vertically stacked on a lower semiconductor layer, wherein the upper semiconductor layer includes a first memory group and a second memory group and the lower semiconductor layer includes a bypass circuit, a method of internally transferring data from the first memory group to the second memory group comprises:

the control logic generates a first memory group row address and a first memory group column address to read first data stored in the first memory group using a first row decoder and a first page buffer;

the control logic activates a connection control signal applied to the bypass circuit to transfer-in the first data to the bypass circuit;

the control logic activates the connection control signal circuit to transfer-out the first data from the bypass circuit to a second page buffer; and the control logic generates a second memory group row address and a second memory group column address to program the first data stored in the second page buffer to the second memory group using the second page buffer and a second row decoder, wherein the first memory group is electrically isolated from the second memory group by a separation region in the upper semiconductor layer, and the bypass circuit underlies at least a portion of the separation region.

19. The method of claim 18 wherein the control logic generates the first memory group row address and the first memory group column address in response to a first command received from a host.

20. The method of claim 18, wherein the first row decoder includes a first row decoder first portion and a first row decoder second portion and the first page buffer includes a first page buffer first portion and a first page buffer second portion, and the first row decoder first portion, the first row decoder second portion, the first page buffer first portion, and the first page buffer second portion are arranged in a first windmill pattern in a portion of the first semiconductor layer underlying the first memory group.

* * * * *